United States Patent
Suminoe et al.

(10) Patent No.: US 6,380,620 B1
(45) Date of Patent: Apr. 30, 2002

(54) TAPE BALL GRID ARRAY SEMICONDUCTOR

(75) Inventors: Shinji Suminoe, Tenri; Kenji Toyosawa, Ikoma; Yasuaki Isobe, Nara, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/373,535

(22) Filed: Aug. 13, 1999

(30) Foreign Application Priority Data

Aug. 31, 1998 (JP) .......................................... 10-246215

(51) Int. Cl.⁷ .......................... H01L 23/10; H01L 23/34
(52) U.S. Cl. ...................... 257/706; 257/701; 257/702; 257/704; 257/707; 257/712; 257/713; 257/778; 257/787; 257/675; 257/737; 257/738
(58) Field of Search ................................. 257/701, 702, 257/704, 706, 707, 712, 713, 778, 787, 717, 737, 780

(56) References Cited

U.S. PATENT DOCUMENTS

| 5,083,191 A | * | 1/1992 | Ueda ......................... 357/68 |
| 5,477,082 A | * | 12/1995 | Buckley, III et al. ....... 257/679 |
| 5,616,958 A | * | 4/1997 | Laine et al. ................ 257/717 |
| 5,900,675 A | * | 5/1999 | Appelt et al. .............. 257/778 |
| 5,905,303 A | * | 5/1999 | Kata et al. .................. 257/701 |
| 5,918,113 A | * | 6/1999 | Higashi et al. ............. 438/119 |
| 5,977,633 A | * | 11/1999 | Suzuki et al. .............. 257/738 |
| 6,249,046 B1 | * | 6/2001 | Hashimoto .................. 257/691 |

FOREIGN PATENT DOCUMENTS

| JP | A8- 88245 | 4/1996 |
| JP | A8-148526 | 6/1996 |
| JP | A9-312374 | 12/1997 |
| JP | A9-330994 | 12/1997 |
| WO | 9612298 | 4/1996 |

* cited by examiner

Primary Examiner—Steven Loke
Assistant Examiner—Nitin Parekh

(57) ABSTRACT

An inner lead and an outer lead are formed only on an insulating tape. A semiconductor chip and the inner lead are connected by the flip chip method by providing an anisotropic conductive material therebetween. A radiating plate is bonded to the insulating tape with use of an adhesive so that the radiating plate covers all regions where solder balls connected with the outer leads are formed. Unlike the TAB type, the inner lead is not uncovered with the insulating tape, whereby deformation of the inner lead is suppressed as much as possible. With this arrangement, the following effect can be achieved. Namely, in a semiconductor device of the BGA type, heat generated during package manufacture can be efficiently emitted, and hence package defects caused by heat and stress during manufacture can be suppressed. As a result, smaller and thinner packages can be manufactured, while pitch narrowing and multiple-port structure can be achieved.

27 Claims, 22 Drawing Sheets

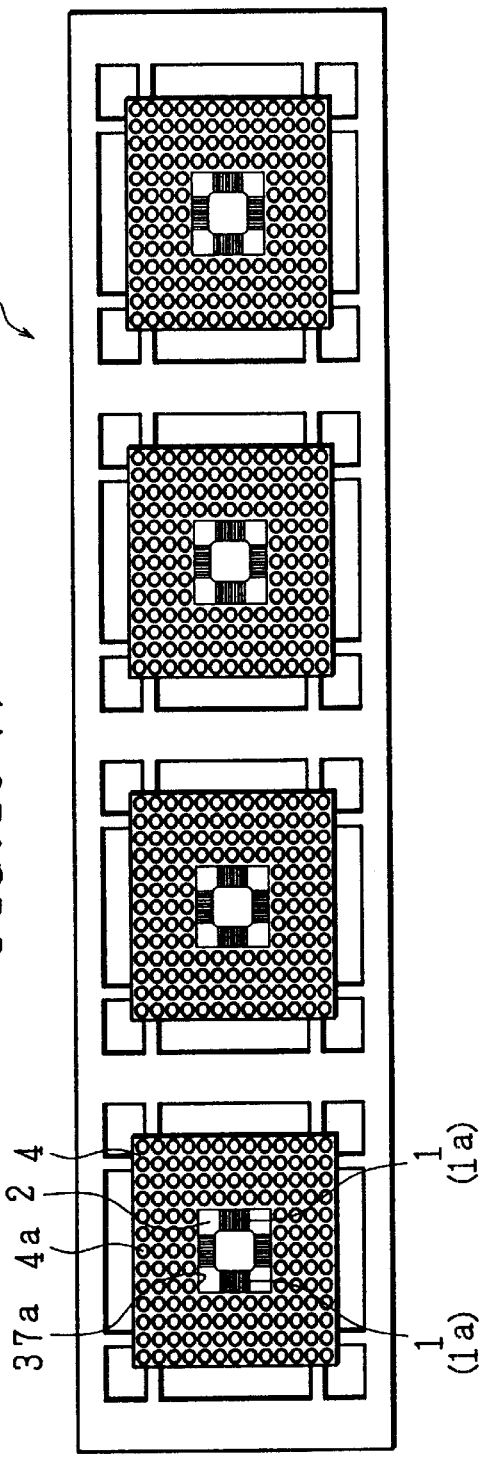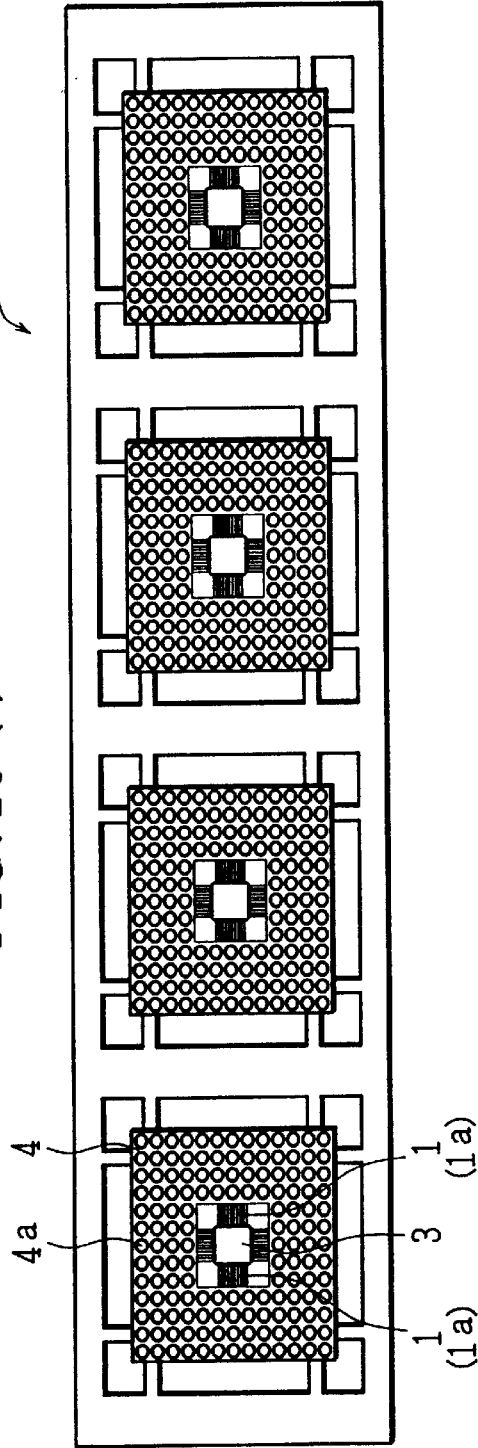

TAPE BALL GRID ARRAY SEMICONDUCTOR

FIELD OF THE INVENTION

The present invention relates to a semiconductor device of a tape ball grid array (BGA) structure, as well as to a method for manufacturing the same.

BACKGROUND OF THE INVENTION

Recently, as multi-functionalization and high integration of semiconductor integrated circuits are promoted, semiconductor devices further smaller and thinner, with more pins, and further superior in heat radiation have been sought for. Therefore, semiconductor devices called BGAs have been attracting attentions, replacing QFPs (quade flat packages) and TCPs (tape carrier packages).

For example, the Japanese Publications for Laid-Open Patent Applications No. 88245/1996 (Tokukaihei 8-88245, Date of Publication: Apr. 2, 1996), No. 148526/1996 (Tokukaihei 8-148526, Date of Publication: Jun. 7, 1996), and No. 312374/1997 (Tokukaihei 9-312374, Date of Publication: Dec. 2, 1997) disclose BGA packages using TAB (tape automatic bonding) tapes. FIG. 17 shows a tape BGA package disclosed in Tokukaihei 8-88245.

As shown in the same figure, a base film 51 as the TAB tape is provided with through holes 52 and a device hole 53, as well as metal wires 54 on a surface thereof. An inner lead 54a of each metal wire 54 is uncovered in the device hole 53 (the inner lead 54a is formed so as to project from the base film 51), and is subjected to inner lead bonding (ILB) with an electrode 55a of a semiconductor chip 55. A sealing resin 56 is applied thereover, so as to coat an element-formed surface of the semiconductor chip 55 and the inner leads 54a.

Lands (outer leads) 54b of the metal wires 54 and an external substrate 57 are connected to each other through solder balls 58. Note that the metal wires 54 on the surface of the base film 51, except portions thereof connected with the electrode 55a and portions thereof in contact with the solder balls 58 (hereinafter referred to as solder ball-bonded portions), are covered with a protective film 59. In this manner, the BGA package of a thin film type applicable to a multi-pin structure.

Furthermore, a permeation hole 54c is formed in the land 54b. When the solder ball 58 is provided on the land 54b so as to form a bump, the solder ball 58 creeps up through the permeation hole 54c to the other side. Therefore, it is possible to check the state of soldering by visually checking the state of the creeping up. Furthermore, it is also possible to check electric characteristics, using the creeping up.

However, since the TAB-type BGA package typically arranged as shown in FIG. 17 uses a TAB tape (base film 51) as a substrate, the BGA package, though facilitating the formation of a multiple-port structure and the pitch narrowing, is inferior in coplanarity due to the solder balls 58 arranged on the base film 51 that is flexible, thereby causing non-uniformity in the connection between the metal wires 54 and the external substrate 57 by self-alignment. This results in that disconnection or defective connection occurs, thereby impairing the yield of the packages.

Then, another BGA package has been conventionally proposed, which is, as shown in FIG. 18, arranged as follows: a metal reinforcing plate 66 (equivalent to a stiffener, a lead frame, or the like) in a frame shape which has stiffness is applied on a surface of an insulating tape 61 as a TAB tape, the surface being on a side opposite to the external substrate-connected side. Here, a method for manufacturing a tape BGA package thus arranged is explained below.

First of all, as shown in FIGS. 19(a) and 19(b), inner leads 62a of metal wires 62 on the insulating tape 61 provided with a device hole 61a, and an electrode 63a of a semiconductor chip 63 are subjected to inner lead bonding. On the other hand, a protective film 64 is formed on the metal wire 62 on the insulating tape 61 except a portion thereof connected with the electrode 63a and the solder ball-bonded portions. Then, as shown in FIG. 19(c), a sealing resin 65 is applied from a side of an element-formed surface of the semiconductor chip 63, so as to coat and protect the element-formed surface and the inner leads 62a.

Next, as shown in FIG. 19(d), the frame-shaped metal reinforcing plate 66 is made to adhere to a back surface of the insulating tape 61 (a surface on a side opposite to the metal wire-formed side). Here, since the inner leads 62a are formed so as to project from the insulating tape 61, if the metal reinforcing plate 66 is attached thereto before the resin sealing, the inner leads 62 are possibly deformed due to stress upon the attachment. To avoid this, the resin sealing is performed before the attachment of the metal reinforcing plate 66 as shown in FIGS. 19(c) and 19(d) so that the inner leads 62 are protected, and thus suppression of deformation of the inner leads 62 is attempted.

Then, as shown in FIG. 19(e), the solder balls 68 for connecting outer leads 62b of the metal wires 62 to an external substrate 67 (see FIG. 18) are formed, thereby ensuring connection between the outer leads 62b and the external substrate 67.

Such device manufacture process is continuously carried out with respect to a tape 69 composed of continuously arranged insulating tapes 61, while the tape 69 is being sent out by reels 60, so that the manufacture process with respect to each insulating tape 61 is continuously carried out. After the metal reinforcing plates 66 are applied, devices are cut out of the tape 69 unit by unit, one unit containing one chip or several chips.

Here, FIG. 21(a) is a plan view of the foregoing tape BGA package obtained by viewing it from the external substrate side (note that the external substrate 67 and the sealing resin 65 are omitted), while FIG. 21(b) is a plan view of the foregoing tape BGA package obtained by viewing it from the metal reinforcing plate 66 side. As shown in FIG. 21(a), a plurality of the solder balls 68 are formed in, for example, a matrix form on the metal wire-formed side of the insulating tape 61, while as shown in FIG. 21(b), the metal reinforcing plate 66 in the frame shape is formed on the back surface of the insulating tape 61.

This arrangement is more or less successful in ensuring coplanarity of the flexible insulating tape 61 and suppressing the warp of the package due to the effect of the metal reinforcing plate 66, and accordingly, possible defects in the electric connection between the metal wires 62 and the external substrate 67 through the solder balls 68 are solved to some extent.

On the other hand, for example, the International Patent Application No. 507344/1997 (Tokuhyohei 9-507344, Date of Publication: Jul. 22, 1997, corresponding to WO96/12298), and the Japanese Publication for Laid-Open Patent Application No. 330994/1997 (Tokukaihei 9-330994, Date of Publication: Dec. 22, 1997) disclose a BGA package of a wire bonding type. As one example of the same, FIG. 22 illustrates a BGA package disclosed by Tokuhyohei 9-507344.

As shown in the same figure, a semiconductor chip 72 is die-bonded to a center recessed part 71a of a lead frame (reinforcing plate) 71 with use of a die bonding paste 73. To the surface of the lead frame 71 except the recessed part 71a, an insulating tape 75 having a conductive pattern 74 such as leads is made to adhere, with adhesive 76. A bump 72a of the semiconductor chip 72 and inner leads 74a of the insulating tape 75 are wire-bonded by a gold wire 77. The semiconductor chip 72 and the gold wire 77 are protected by sealing resin 78. Outer leads 74b and the external substrate 79 are connected to each other through the solder balls 80. Incidentally, the conductive pattern 74 on the surface of the insulating tape 75, except portions thereof connected to the bumps 72a and the solder ball-bonded portions, is coated by the protective film 81.

This arrangement, since having the lead frame 71 on the back surface of the insulating tape 75, enjoys excellent coplanarity and improved electric connection with the external substrate 79.

Incidentally, in the wire bonding type wherein one bump 72a and one inner lead 74a in pair are subjected to wire bonding, terminals necessarily have wider pitch as compared with the TAB type. Therefore, generally, the wire bonding type has inferior to the TAB type in further narrowing the pitch and achieving better multiple-port structure.

However, since the inner lead 62a of the foregoing BGA package is uncovered in the device hole 61a, it tends to deform due to stress or the like during manufacture. As a result, package defects caused by the stress tend to take place, as well.

Besides, as to the TAB-type BGA package typically arranged as shown in FIG. 18, the connection of the electrode 63a of the semiconductor chip 63 with the inner lead 62a, the resin sealing, the attachment of the metal reinforcing plate 66 to the insulating tape 61, the formation of the solder ball 68, the installation of the package on the external substrate 67, and the like are carried out at a high temperature of not lower than 200° C. Such a condition of continuous high temperature surely adversely affects the insulating tape 61 and the semiconductor chip 63, thereby leading to package defects.

In the foregoing TAB-type BGA package, however, the metal reinforcing plate 66 which is intended to ensure the coplanarity of the insulating tape 61 seems to have more or less a heat radiating function since being made of a metal, but the heat radiation is possible at limited parts of the surface of the insulating tape 61 since the metal reinforcing plate 66 is disposed only in the vicinity of edges of the insulating tape 61, thereby achieving an extremely poor effect of the heat radiation. As a result, there occur such problems as damages to the insulating tape 61 and package defects, due to influences of heat generated during the manufacture and installation of the package.

On the other hand, in the wire-bonding-type BGA package typically arranged as shown in FIG. 22, the gold wire 77 has to be curved upward (downward in the figure) from the bump 72a, to avoid contact of the gold wire 77 with the semiconductor chip 72. Likewise, the gold wire 77 has to be curved upward (downward in the figure) from the inner lead 74a, to avoid contact of the gold wire 77 with other inner leads 74a. Therefore, as the chip becomes subjected to resin sealing, the resin-sealed portions thereof become thicker as compared with those of the TAB-type package. If the resin-sealed portions become thicker, with solder balls 80 having smaller diameters than a desired one, the resin-sealed portions are caused to come into contact with the external substrate 79, thereby resulting in that the installation of the package on the external substrate 79 becomes difficult. Therefore, it becomes necessary to increase the diameter of the solder balls 80. Consequently, the foregoing arrangement of the BGA package cannot allow the package to be formed thinner and smaller.

SUMMARY OF THE INVENTION

The object of the present invention is to provide (1) a semiconductor device of the BGA type which is arranged so as to at least efficiently radiate heat generated during package manufacture as well as to suppress package defects resulting on heat and stress during manufacture, and which is arranged so as to be formed thinner and smaller and to have narrower pitch and a multi-port structure, and (2) a method of manufacturing of such a semiconductor device.

To achieve the foregoing object, a semiconductor device of the present invention is characterized by including (i) a conductive pattern composed of an inner lead section and an outer lead section, the conductive pattern being provided only on an insulating tape, (ii) a plurality of external connection terminals in a protuberance form each, each being connected with the outer lead section at an opening of a protective film, the protective film being formed so as to cover at least the outer lead section of the conductive pattern, (iii) an integrated circuit chip bonded with the inner lead section so that an element-formed surface of the integrated circuit chip faces the insulating tape, and (iv) a first radiating member with a heat radiating property, provided on a surface of the insulating tape on a side opposite to a conductive pattern-formed side thereof so as to cover at least all regions where the external connection terminals are formed.

With the foregoing arrangement in which the inner lead section is formed only on the insulating tape, the inner lead section is never uncovered with the insulating tape. In other words, the inner lead section as a whole is supported by the insulating tape. This ensures that deformation due to stress during manufacture is prevented from easily occurring to the inner lead section, thereby resulting in that package defects resulting on the foregoing stress are prevented.

Furthermore, since the first radiating member is formed on the surface of the insulating tape, it is possible to efficiently and surely emit heat generated during respective steps of the semiconductor device manufacturing process and during the installing step to outside through the first radiating member.

More specifically, in the case of the conventional package equipped with the frame-shaped metal reinforcing plate, an effect of emitting heat of the insulating tape is poor since heat radiation by the metal reinforcing plate is effective only partially with respect to the insulating tape surface. In the foregoing arrangement, however, wherein the first radiating member is formed so as to cover at least all regions where the external connection terminals are formed, the first radiating member has a surface incomparably larger than the metal reinforcing plate, and is capable of surely emitting heat of the entire insulating tape. Moreover, in the case where, for example, another first radiating member is provided at a position vis-a-vis the integrated circuit chip, heat generated during operations of the device can be emitted through the first radiating member.

Thus, the foregoing arrangement produces a remarkably excellent radiating effect as compared with the conventional cases, thereby ensuring that damages to the insulating tape and the integrated circuit chip by heat generated during the manufacturing process and during operations of the device are surely avoided. As a result, package defects resulting on the foregoing heat can be surely reduced.

Furthermore, the integrated circuit chip is connected with the inner lead section formed only on the insulating tape through a pressing operation. This connecting method, which is called as "flip chip method," does not require a metal wire for connecting the integrated circuit chip and the inner lead section which is required in the wire bonding method, and therefore the pitch narrowing and the formation of the multi-port structure are facilitated. Besides, since to form the inner lead sections at narrower spaces on the insulating tape is easier, the foregoing arrangement is particularly effective for the pitch narrowing.

Furthermore, packages formed by the wire bonding method cannot help becoming thick since resin sealing is applied so as to cover the wires, whereas packages formed by the foregoing arrangement are formed thinner as compared with those formed by the wire bonding method, since such wires are unnecessary.

To achieve the aforementioned object, a method for manufacturing the semiconductor device in accordance with the present invention, which is a method for manufacturing a semiconductor device including (i) a conductive pattern composed of an inner lead section and an outer lead section, the conductive pattern being provided only on an insulating tape, and (ii) a plurality of external connection terminals in a protuberance form each, each being connected with the outer lead section through an aperture of a protective film which is formed so as to cover at least the outer lead section of the conductive pattern, (iii) an integrated circuit chip, and (iv) a radiating member which covers at least all regions where the external connection terminals are formed, is characterized by comprising the steps of (a) causing the insulating tape to adhere to the radiating member, with a surface of the insulating tape on a side opposite to a conductive pattern-formed side thereof being in contact with the radiating member, and (b) after the step (a), bonding the integrated circuit chip with the inner lead section so that an element-formed surface of the integrated circuit chip faces the insulating tape.

By the foregoing method, since the conductive pattern is formed only on the insulating tape, the conductive pattern is not prone to deformation in the middle of the manufacturing process. Therefore, the foregoing arrangement allows the step of bonding the insulating tape to the radiating member, which step relatively tends to apply stress on the insulating tape, to be conducted before the step of connecting the integrated circuit chip with the inner lead section; such manufacturing process has conventionally been infeasible since the inner lead section was formed partially outside the insulating tape. Accordingly, the foregoing manufacturing method has become selectable as a method to form the semiconductor device manufacturing method, thereby broadening the range of available manufacturing methods.

Furthermore, unlike a semiconductor device of the TAB type, a step of providing a device hole in the insulating tape for installation of an integrated circuit chip is unnecessary, thereby resulting in that the device manufacturing process is simplified.

To achieve the aforementioned object, another method for manufacturing a semiconductor device in accordance with the present invention, which is a method for manufacturing a semiconductor device including (i) a conductive pattern composed of an inner lead section and an outer lead section, the conductive pattern being provided only on an insulating tape, and (ii) a plurality of external connection terminals in a protuberance form each, each being connected with the outer lead section through an aperture of a protective film, the protective film being formed so as to cover at least the outer lead section of the conductive pattern, (iii) an integrated circuit chip, and (iv) a radiating member which covers at least all regions where the external connection terminals are formed, is characterized by comprising the steps of (a) bonding the integrated circuit chip with the inner lead section so that an element-formed surface of the integrated circuit chip faces the insulating tape, and (b) after the step (a), causing the insulating tape to adhere to the radiating member with a surface of the insulating tape on a side opposite to a conductive pattern-formed side thereof being in contact with the radiating member.

According to the foregoing method, the integrated circuit chip is connected with the inner lead section before the insulating tape is bonded with the radiating member. Therefore, it is possible to perform the integrated circuit chip-inner lead section bonding step with respect to a plurality of chips simultaneously, by using a tape in which insulating tapes for a plurality of chips are continuously formed. This method enables improvement of the throughput of the semiconductor device.

Furthermore, unlike a semiconductor device of the TAB type, a step of providing a device hole in the insulating tape for installation of an integrated circuit chip is unnecessary, thereby resulting in that the device manufacturing process is simplified.

To achieve the aforementioned object, still another method for manufacturing a semiconductor device in accordance with the present invention is characterized by including the steps of (a) forming a lead frame including a plurality of radiating regions formed so as to cover at least all regions where a plurality of external connection terminals each in a protuberance form are provided, (b) causing an insulating tape having a conductive pattern thereon to adhere to each radiating region, with a surface of the insulating tape on a side opposite to a conductive pattern formed-surface being in contact with the radiating region, the conductive pattern of the insulating tape being composed of an inner lead section and an outer lead section, the insulating tape having a protective film covering at least the outer lead section, (c) bonding the integrated circuit chip with the inner lead section so that an element-formed surface of the integrated circuit chip faces the insulating tape, (d) connecting each external connection terminal in the protuberance form with the outer lead section through an aperture of the protective film, and (e) cutting the lead frame so that the radiating regions are separated from each other.

According to the foregoing arrangement, the conductive pattern is formed only on the insulating tape, hence the conductive pattern is not prone to deformation in the middle of the manufacturing process. Therefore, the foregoing arrangement allows the step of bonding the insulating tape to the radiating member, which step relatively tends to apply stress on the insulating tape, to be conducted before the step of connecting the integrated circuit chip with the inner lead section; such manufacturing process has conventionally been infeasible since the inner lead section was formed partially outside the insulating tape. Accordingly, the foregoing manufacturing method has become selectable as a method to form the semiconductor device manufacturing method, thereby broadening the range of available manufacturing methods.

Furthermore, according to the foregoing method, a plurality of chips are simultaneously formed using a lead frame having a plurality of radiating regions, thereby resulting in that the throughput of the semiconductor device is improved as compared with the other aforementioned methods.

Furthermore, unlike a semiconductor device of the TAB type, a step of providing a device hole in the insulating tape for installation of an integrated circuit chip is unnecessary, thereby resulting in that the device manufacturing process is simplified.

For a fuller understanding of the nature and advantages of the invention, reference should be made to the ensuing detailed description taken in conjunction with the accompanying drawings.

BRIEF DESCRIPTION OF THE DRAWINGS

FIG. 13(a) is a plan view illustrating a lead frame in a state in which the insulating tape is applied to each radiating plate, and FIG. 13(b) is a plan view illustrating a lead frame in a state in which thereafter an inner lead of the insulating tape and a semiconductor chip are bonded with each other.

DESCRIPTION OF THE PREFERRED EMBODIMENTS

[First Embodiment]

The following description will explain an embodiment of the present invention while referring to FIGS. 1 through 7.

Figure 1:
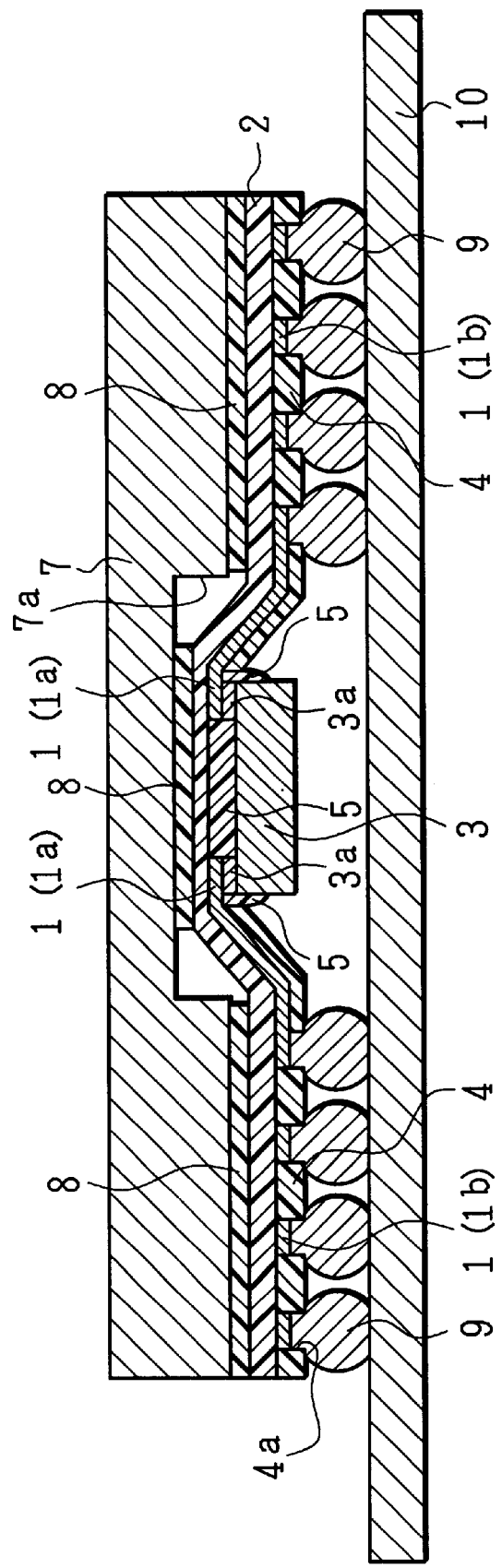
FIG. 1 is a cross-sectional view illustrating a schematic arrangement of a semiconductor device in accordance with one embodiment of the present invention.
Figure 2:
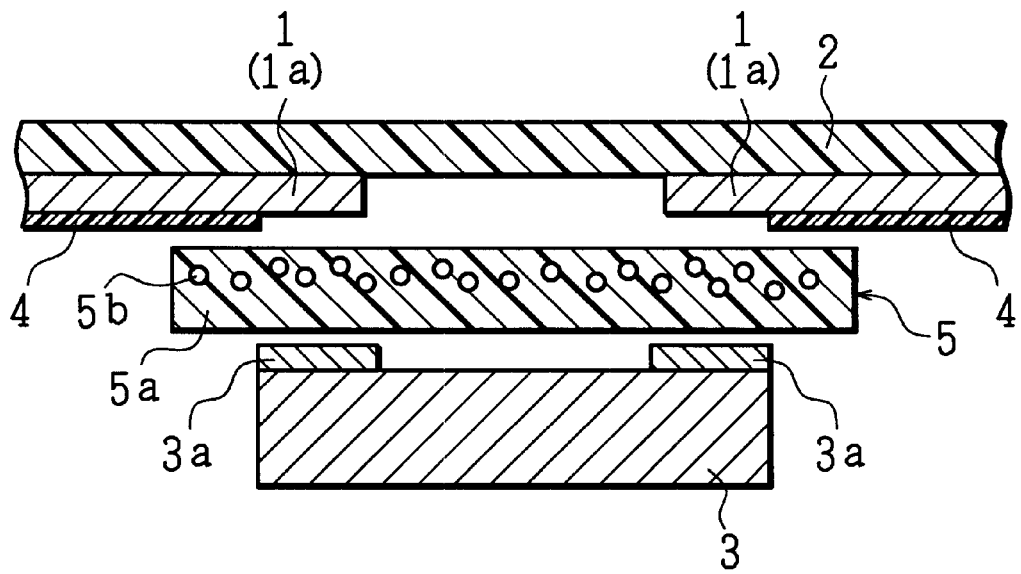
FIG. 2(a) is a cross-sectional view illustrating a state before a semiconductor chip and an inner lead are pressed against each other with an anisotropic conductive material provided therebetween.
FIG. 2(b) is a cross-sectional view illustrating a state after the pressing.
Figure 2:
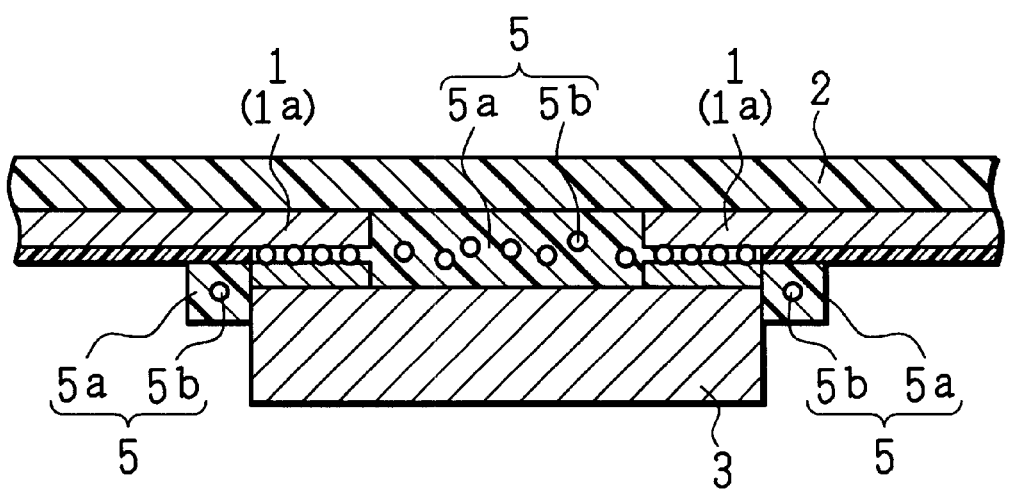

A semiconductor device in accordance with the present embodiment is a film carrier-type semiconductor device having a plurality of solder balls 9 (external connection terminals) each in a protuberance form. The semiconductor device has, as shown in FIG. 1, an insulating tape 2 on whose surface a plurality of leads 1 (conductive pattern) made of, for example, copper foils are formed. The lead 1 is composed of an inner lead 1a connected to a semiconductor chip 3 (integrated circuit chip) and an outer lead 1b connected to the solder ball 9. The entire lead 1 except a portion thereof connected to a bump 3a of the semiconductor chip 3 and a portion in contact with the solder ball (hereinafter referred to as solder ball-bonded region) is coated with a protective film 4 (solder resist). In other words, at least the outer lead 1b of the lead 1 is coated with the protective film 4. The protective film 4 is provided with apertures 4a at respective positions corresponding to the solder balls 9.

The insulating tape 2 is formed with, for example, polyimide or urethane, to a thickness of 10 $\mu$m to 75 $\mu$m. A device hole which is formed in the case of the TAB type is not formed in the insulating tape 2, and accordingly, the inner lead 1a and the outer lead 1b are disposed only on the insulating tape 2. Incidentally, the insulating tape 2 may have a double-layer structure made of a tape and a copper foil as described above, or may have a trilaminar structure in which a tape and a copper foil are made to adhere to each other with an adhesive.

The semiconductor chip 3 has a thickness of 625 $\mu$m, for example, and the bump 3a of the semiconductor chip 3 and the inner lead 1a are connected to each other with an anisotropic conductive material 5 provided therebetween in a manner such that an element-formed surface of the semiconductor chip 3 and the insulating tape 2 face each other. The anisotropic conductive material 5 is composed of, for example, an ACF (anisotropic conductive film) or ACL (anisotropic conductive liquid) which is made of an insulating resin 5a with conductive particles 5b of a metal or the like dispersed therein, as shown in FIG. 2(a).

The anisotropic conductive material 5 shaped larger than the semiconductor chip 3 is provided between the insulating tape 2 and the semiconductor chip 3, which are pressed against to each other while the anisotropic conductive material 5 is heated. Then, as shown in FIG. 2(b), the bump 3a sinks in the anisotropic conductive material 5, thereby bringing the conductive particles 5b into contact with both the inner lead 1a and the bump 3a. As a result, the bump 3a and the inner lead 1a are electrically connected to each other through the conductive particles 5b.

On the other hand, since the anisotropic conductive material 5 between portions of the semiconductor chip 3 other than the bump 3a and the insulating tape 2 is not so much pressed as that between the bump 3a and the inner lead 1a is, the conductive particles 5b therein are not brought into contact with both the semiconductor chip 3 and the insulating tape 2 simultaneously, remaining dispersed in the insulating resin 5a. Therefore, in this area, the insulating tape 2 and the semiconductor chip 3 are electrically insulated from each other due to the presence of the anisotropic conductive material 5 therebetween.

Such a method whereby the semiconductor chip 3 and the inner lead 1a provided only on the insulating tape 2 are thus fixed to each other by pressing is generally called "flip chip method."

In the case of the conventional wire bonding type or the TAB type in which a bump and an inner lead are subjected to thermocompression, a relatively high temperature of around 500° C. is necessary since the bump and the inner lead are connected to each other in an eutectic state. In contrast, in the present embodiment, the bump 3a and the inner lead 1a can be electrically connected at a relatively low temperature (at most around 400° C.), since they are connected by the flip chip method using the anisotropic conductive material 5. As a result, damages to the insulating tape 2 and the semiconductor chip 3 can be reduced, while the reliability of the package is improved.

Furthermore, since the anisotropic conductive material 5 serves as underfill that is a protective material for protecting the element-formed surface of the semiconductor chip 3, the underfill material applying step becomes unnecessary. In other words, the use of the anisotropic conductive material 5 allows the step of connecting the bump 3a and the inner lead 1a and the resin sealing step to be integrated into one step. This results in simplification of the manufacture process, which ensures improvement of manufacturing efficiency of the package as well as lowering of costs.

Incidentally, the bump 3a and the inner lead 1a may be connected by thermocompression as in conventional cases. In this case, the space between the semiconductor chip 3 and the insulating tape 2 and at least parts of the inner lead 1a uncovered with the protective film 4 are sealed with the underfill material.

Here, in the case where specifically the stiffness of the package has to be increased or the semiconductor chip 3 has to be surely protected, the whole of the semiconductor chip 3 may be covered with the underfill material. On the other hand, in the case where the diameter of the solder balls 9 which will be described later is set so that the back surface of the semiconductor chip 3 (the surface on a side opposite to the element-formed surface side) and an external substrate 10 which will be described later are out of contact with each other at all times, the back surface of the semiconductor chip 3 does not have to be protected. Therefore, in this case, there is no need to apply the underfill material to the back surface of the semiconductor chip 3, and therefore, the package can be formed further thinner in this case.

On a back surface of the insulating tape 2, that is, a surface of the insulating tape 2 on a side opposite to the lead-formed surface side, a radiating plate 7 (radiating member, first radiating member) having a heat radiating property is provided so as to cover at least all the solder ball-bonded regions. The radiating plate 7 is composed of a metal plate made of, for example, copper, or 42 alloy, from the viewpoint of facilitation of processing.

The radiating plate 7 is provided with a recessed part 7a as a region at which the semiconductor chip is installed. The recessed part 7a is formed sufficiently larger than the semiconductor chip 3, and can be easily formed by a common processing method called half-etching method, whereby etching is carried out with respect to the radiating plate 7 only to a desired extent with use of a chemical. A depth of the recessed part 7a is desirably about 100 μm to 500 μm, considering production of the recessed part 7a, coplanarity, and thickness of the package.

The insulating tape 2 is bent in a manner such that the semiconductor chip 3 is placed in the recessed part 7a and/or that a portion of the insulating tape 2 corresponding to a semiconductor chip-installed region (a region which includes at least a region facing the semiconductor chip 3) fits in the recessed part 7a. Further, in the present embodiment, the portion of the insulating tape 2 corresponding to the semiconductor chip-installed region and a portion of the recessed part 7a facing the insulating tape 2 are made to adhere to each other with an adhesive 8, while the surface of the radiating plate 7 except the recessed part 7a is made to partially adhere with the adhesive 8 to the insulating tape 2.

Incidentally, the insulating tape 2 and the radiating plate 7 may be made to entirely adhere to each other with the adhesive 8 applied to the whole surface of the portions thereof in contact with each other. The adhesion of the insulating tape 2 and the radiating plate 7 may be carried out after the bonding of the inner lead 1a of the insulating tape 2 with the bump 3a of the semiconductor chip 3 (after assembly), or may be carried out before it (before assembly).

The outer lead 1b formed on the surface of the insulating tape 2 is connected to each solder ball 9 as a projection electrode at each aperture 4a of the protective film 4. The solder ball 9 is formed in, for example, a ball-like projection form with a diameter of, for example, 0.5 mm to 1.0 mm by the print reflow method and the ball supply method. Incidentally, the print reflow method is a method wherein a metal paste is printed on the substrate and heated (reflow), and the ball supply method is a method wherein a pattern is formed on the substrate, to which metal balls are supplied by means of flux or the like, and subjected to reflow.

The shape of the solder ball 9 is not particularly limited to a sphere, and it may be another solid figure (for example, a column). To form the solder ball 9 in a spherical shape, however, is preferable since advantages can be achieved such as easier manufacture and easier control on the size of each solder ball 9 as compared with the cases of forming it into another solid shape.

Incidentally, the solder ball 9 is usually formed after the bump 3a of the semiconductor chip 3 is bonded with the inner lead 1a, but the solder ball 9 may be formed before the bonding step. The external substrate 10 is connected to the semiconductor chip 3 through the solder balls 9.

In the foregoing arrangement in which the semiconductor chip 3 and the insulating tape 2 are connected by the flip chip method, the inner lead 1a which is uncovered in the case of the TAB style is not uncovered in this case. This arrangement ensures prevention of deformation of the inner lead 1a due to an external force exerted thereto during the manufacturing process, whereby package defects resulting on application of the forgoing external force can be reduced. Besides, since wire bonding imperatively applied with respect to each wire in the case of the wire bonding type is unnecessary in this case, the formation of a multiple-port structure and the pitch narrowing are facilitated.

Furthermore, since the radiating plate 7 is formed on the back side of the insulating tape 2, heat generated in the package manufacturing steps and the package installing step can be surely and efficiently radiated to outside by means of the radiating plate 7.

More specifically, the conventional package equipped with the frame-form metal reinforcing plate is only capable of partially radiating heat from the insulating tape surface and is incapable of radiating heat from the entire insulating tape, whereas in the present embodiment in which the radiating plate 7 is formed so as to cover at least all the solder ball-bonded regions (cover the entire surface of the insulating tape 2), the area of the surface of the radiating plate 7 is incomparably larger than that of the foregoing metal reinforcing plate, thereby ensuring that heat of the entire insulating tape 2 is surely radiated by means of the radiating plate 7. Furthermore, in the case where the radiating plate 7 is also present at regions facing the semiconductor chip 3 as in the present embodiment, heat generated by operation of the device is also radiated to outside through the radiating plate 7.

Thus, in the foregoing arrangement, since a drastically higher radiation effect as compared with the conventional case can be achieved, damages to the insulating tape 2 and the semiconductor chip 3 caused by the heat generated during the manufacturing process and operations of the device can be surely avoided. As a result, package defects caused by the foregoing heat can be surely reduced.

Moreover, since the semiconductor chip 3 is positioned with a displacement to the recessed part 7a side corresponding to a depth of the recessed part 7a, the back surface of the semiconductor chip 3 and the external substrate 10 are not brought into contact with each other even in the case where the diameter of the solder ball 9 is reduced by a predetermined dimension. Therefore, it is possible to reduce the diameter of the solder ball 9 as compared with the common diameter of 0.5 mm to 1.0 mm, keeping the back surface of the semiconductor chip 3 and the external substrate 10 not in contact with each other. As a result, the effect of making the package thinner is surely achieved, as compared with the cases of the conventional TAB method and the wire bonding method.

In short, with the arrangement of the present embodiment, reduction of package defects and thinning of package can be simultaneously accomplished.

Furthermore, the radiating plate 7 which is made of metal functions as a reinforcing member. Since the such radiating plate 7 and the portion of the insulating tape 2 corresponding to the semiconductor chip-installed region are made to adhere to each other with the adhesive 8, deformation of the insulating tape 2, the inner lead 1a, and the like caused by stress during the manufacturing process can be surely prevented, thereby resulting in that the semiconductor chip 3 made to adhere to the insulating tape 2 can be stably installed.

Incidentally, in the recessed part 7a the insulating tape 2 is not necessarily fixed to the radiating plate 7, and if no stress is exerted thereto from the radiating plate 7, the insulating tape 2 does not have to be fixed. In this case, the position of the semiconductor chip 3 in the recessed part 7a is changeable in the depth direction of the recessed part 7a, and hence, the accuracy in installation of the semiconductor chip 3 in the recessed part 7a is allowed to be eased, while the thickness of the package can be adjusted.

Figure 3:
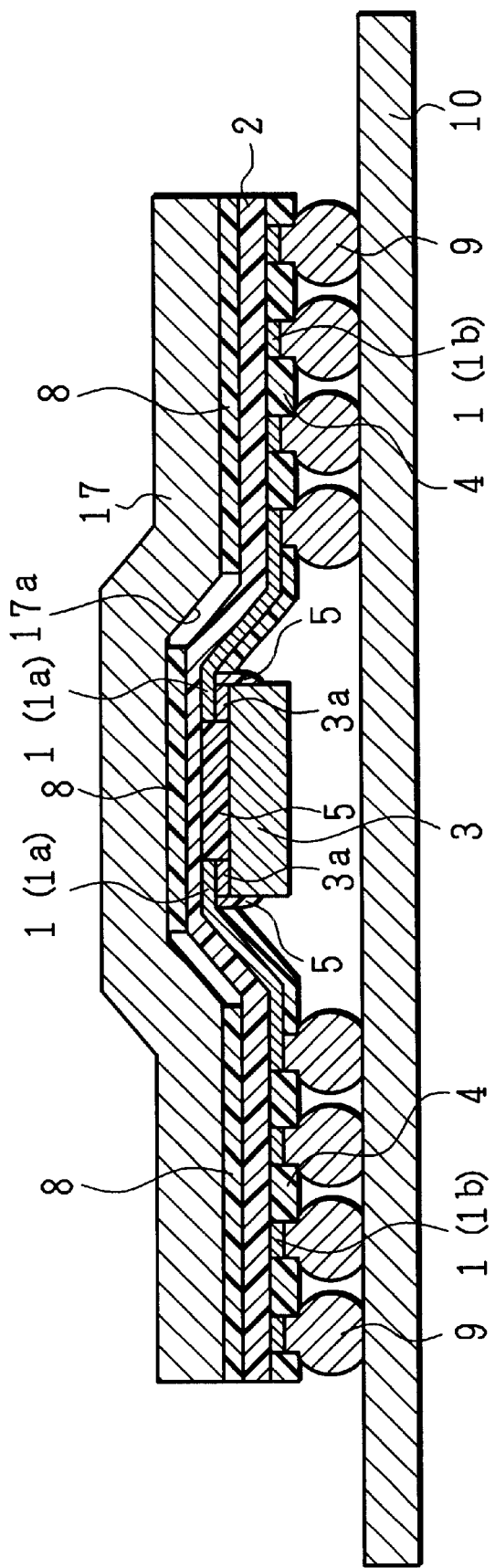
FIG. 3 is a cross-sectional view illustrating an arrangement of a semiconductor device in which a radiating plate in a flat plate form with a uniform thickness is bent so as to form a recess.

The foregoing description of the present embodiment explains a case where the portion of the radiating plate 7 corresponding to the semiconductor chip-installed region is half-etched so as to form the recessed part 7a, but a recessed part may be formed in different manners. For example, instead of the recessed part 7a, a recessed part 17a may be formed by bending a radiating plate 17 (radiating member, first radiating member) with a uniform thickness so as to have a level difference in the thickness direction, as shown in FIG. 3. The bending of the radiating plate 17 is carried out by, for example, the stamping method wherein a metal plate is stamped. In this case, the insulating tape 2 is arranged, for example, substantially along the surface of the radiating plate 7.

In the case where the recessed part 17a is formed in the foregoing manner, the formation of the same is easier as compared with, for example, the case where it is formed by etching, since chemicals required in etching are unnecessary.

Figure 4:
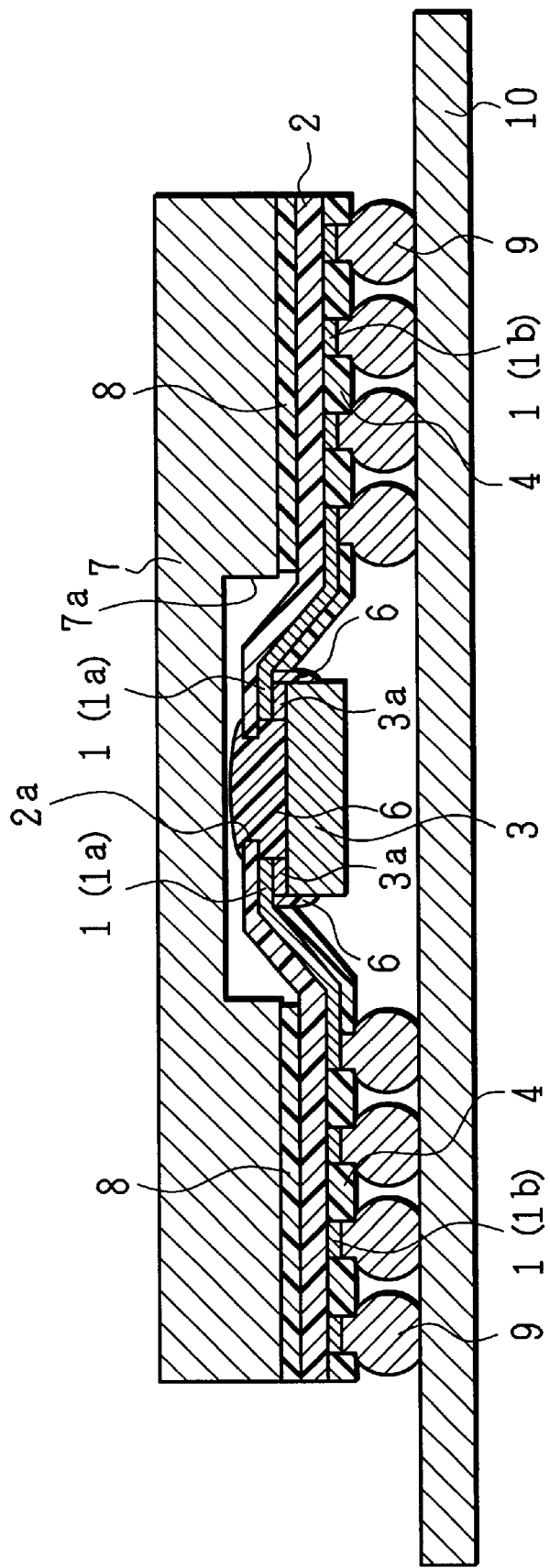
FIG. 4 is a cross-sectional view illustrating an arrangement of a semiconductor device in a state in which a perforation is formed in an insulation tape at a position corresponding to a semiconductor chip-installed region and an underfill material is applied so as to reach a back surface of the insulating tape through the perforation.

Furthermore, an underfill material may be used as the sealing resin, in the place of the anisotropic conductive material 5. In addition, as shown in FIG. 4, a perforation 2a may be formed in the insulating tape 2 at a position corresponding to the semiconductor chip-installed region, and the underfill material 6 may be applied so as to, through the perforation 2a, reach the back surface of the insulating tape 2. In this case, the adhesion of the insulating tape 2 and the semiconductor chip 3 can be reinforced by means of the underfill material 6. This ensures sure prevention of package crack.

Figure 5:
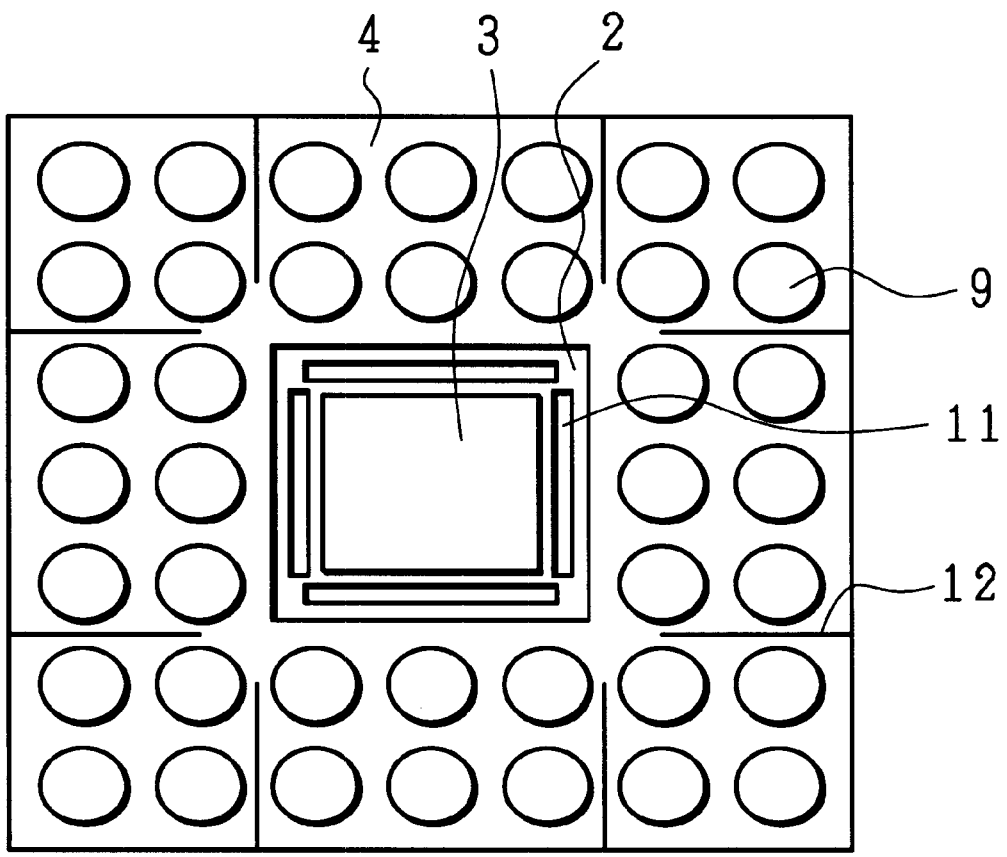
FIG. 5 is a plan view of the insulating tape with slits and cuts formed therein, viewed from an external substrate side.

Furthermore, as shown in FIG. 5, slits 11 may be formed in the insulating tape 2, around the semiconductor chip-installed region, or cuts 12 may be formed in the insulating tape 2 so as to extend a predetermined length from the edges of the insulating tape 2 toward the inside. In this case, stress due to thermal expansion of the insulating tape 2 in the semiconductor manufacturing process, etc. is eased by the slits 11 and/or the cuts 12, warp of the insulating tape 2 can be reduced. As a result, deformation of the insulating tape 2 is suppressed, thereby ensuring a decrease in defective articles.

Furthermore, since the device is produced at a high temperature of 200° C. or above, moisture (steam) comes to stay at an interface between the sealing resin (for example, the anisotropic conductive material 5) and the insulating tape 2 through the manufacturing process, but the foregoing arrangement enables to let such moisture out through the slits 11 and/or the cuts 12. Therefore, if a drastic temperature change occurs in the manufacturing process, separation between the sealing resin and the insulating tape 2 due to moisture staying at the interface therebetween can be avoided, and the adhesion thereof to each other can be maintained.

Incidentally, such slits 11 and/or cuts 12 are applicable to the radiating plate 7. In the case where the slits 11 and/or cuts 12 are formed in both an insulating tape 2 and a radiating plate 7 which have different coefficients of thermal expansion, stress caused by expansion of one of the two is eased by the slits 11 and/or cuts 12 of the other. Therefore, in this case, the aforementioned effect is surely achieved, whereby a more desirable arrangement is accomplished.

Figure 6:
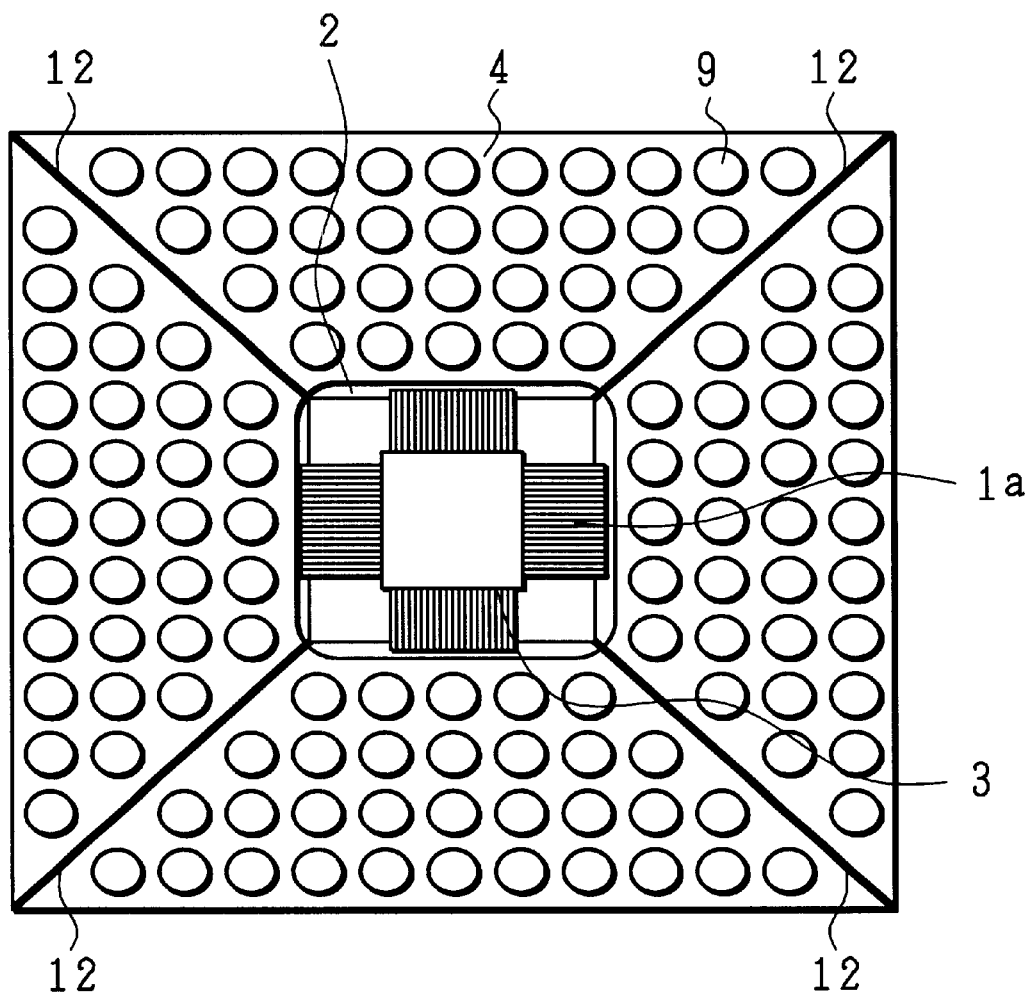
FIG. 6 is a plan view of the insulating tape with cuts formed therein substantially along diagonals, viewed from the external substrate side.

As shown in FIG. 6, the cuts 12 in the insulating tape 2 may be formed so as to extend a predetermined length each substantially along diagonals of the insulating tape 2 from each vertex toward the inside of the tape. In the case where the cuts 12 are formed from each edge of the insulating tape 2 toward the inside so as to meet the edge at a right angle, conductive patterns in the vicinity of the vertexes of the insulating tapes 2 tend to be unusable patterns since each of them is surrounded by two edges meeting at the vertex and two cuts 12. By contrast, in the case of FIG. 6, conductive patterns in the vicinity of the vertexes in the insulating tape 2 are not surrounded by the cuts 12 and the like, and they do not become unusable patterns. Therefore, the foregoing conductive patterns in the vicinity of the vertexes can be efficiently used.

Furthermore, with the cuts 12 provided at such positions, the portion of the insulating tape 2 corresponding to the semiconductor chip-installed region can be easily fit into the recessed part 7a of the radiating plate 7, as compared with the case shown in FIG. 5. In other words, the foregoing arrangement has an advantage in that the insulating tape 2 can be bent and fit not forcibly. Besides, in this case, stress after the insulating tape 2 is bent and made to adhere to the radiating plate 7 is also surely eased by means of the cuts 12.

Figure 7:
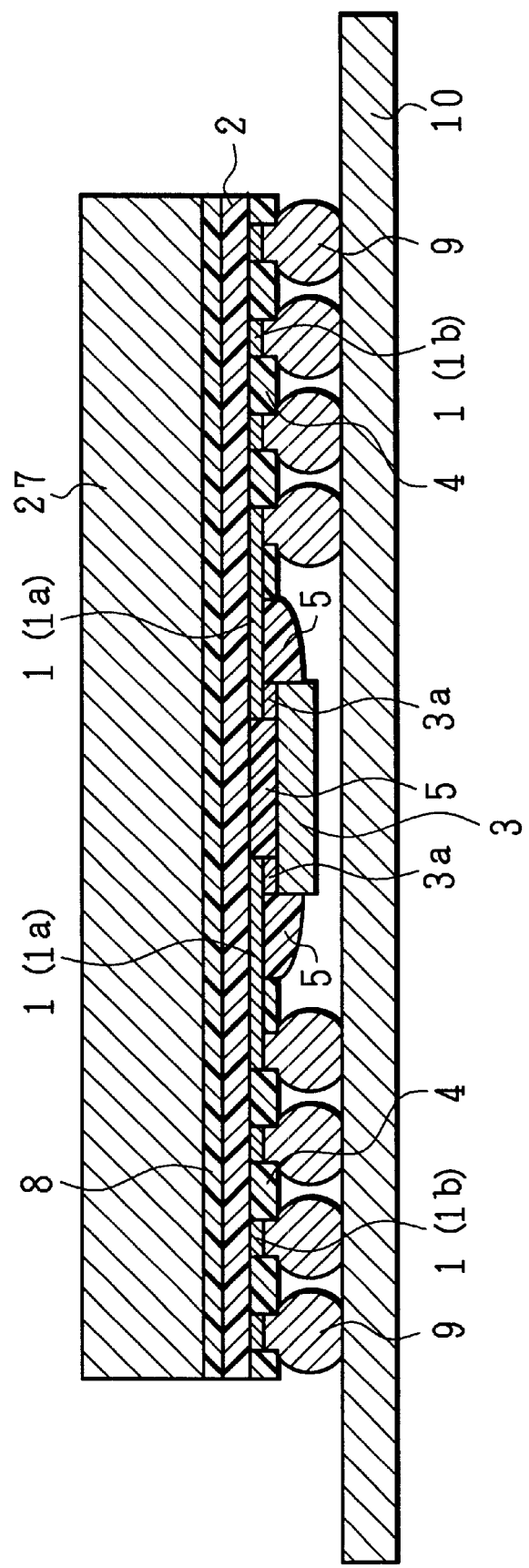
FIG. 7 is a cross-sectional view illustrating an arrangement of a semiconductor device in which the insulating tape is made to adhere to the radiating plate in a flat plate form with a uniform thickness in which a recess is not formed.

Furthermore, the foregoing description of the present embodiment explains the case where the recessed part 7a is formed in the radiating plate 7, but the recessed part 7a is not necessarily formed. A radiating plate 27 (radiating member) in a plate form with a uniform thickness as shown in FIG. 7 may be used in the place of the radiating plate 7, and the insulating tape 2 may be made to adhere to the entire surface of the radiating plate 27.

In the foregoing arrangement, the aforementioned half-etching step or stamping step for forming the recessed part 7a can be omitted, resulting in further improvement of the manufacturing efficiency as well as further lowering of the cost.

Furthermore, since the semiconductor chip 3 projects more from a level of the radiating plate 27 as compared with the case shown in FIG. 1, such projection can be suppressed to some extent by, for example, polishing the back surface of the semiconductor chip 3 (a surface on a side opposite to the element-formed surface side) to adjust the thickness of the semiconductor chip 3 to around 500 $\mu$m (preferably 200 m to 250 $\mu$m). More specifically, it is desirable that the thickness of the semiconductor chip 3 is set so that the semiconductor chip 3 projects from the level of the radiating plate 27 less than the solder balls 9 do from the level of the radiating plate 27. Therefore, in the case where the radiating plate 27 is used, the semiconductor chip 3 is desirably subjected to the aforementioned polishing. Besides, in the case where the solder balls 9 are installed and are subjected to reflow, the diameter of each of the solder balls 9 is preferably set to not less than 700 $\mu$m, to avoid the back surface of the semiconductor chip 3 coming into contact with the external substrate 10.

[Second Embodiment]

The following description will explain another embodiment of the present invention, while referring to FIGS. 8 through 12, 13(*a*), 13(*b*), 14(*a*), and 14(*b*). Incidentally, the members having the same structure (function) as those in the first embodiment will be designated by the same reference numerals and their description will be omitted.

Figure 8:
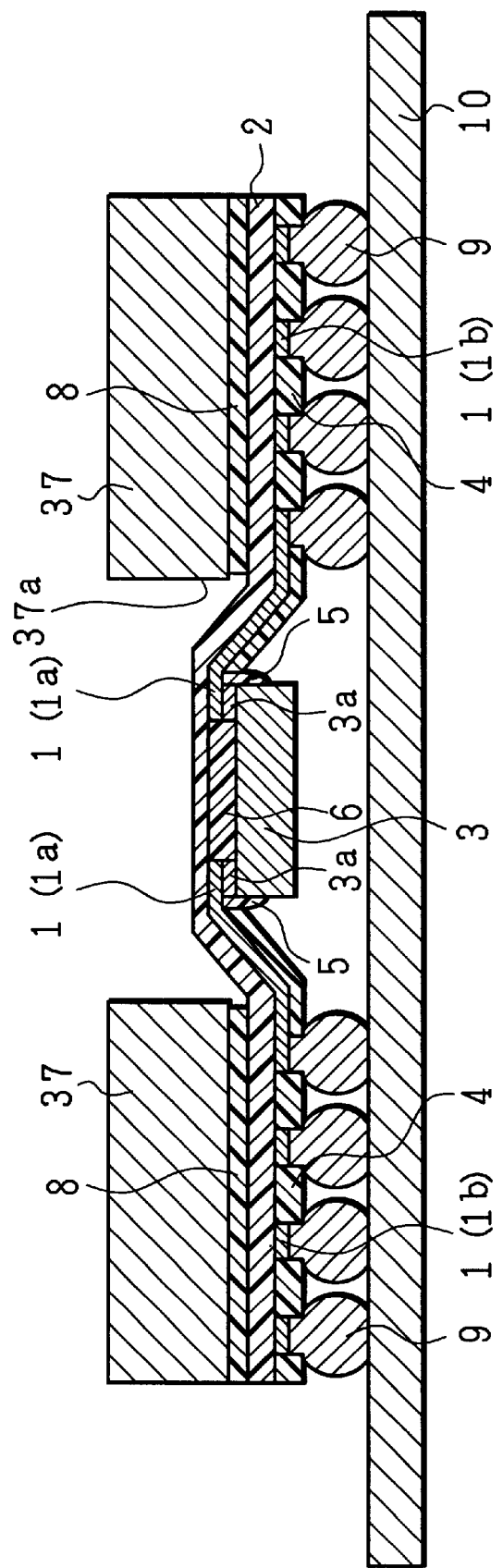
FIG. 8 is a cross-sectional view illustrating a schematic arrangement of a semiconductor device in accordance with another embodiment of the present invention.
Figure 9:
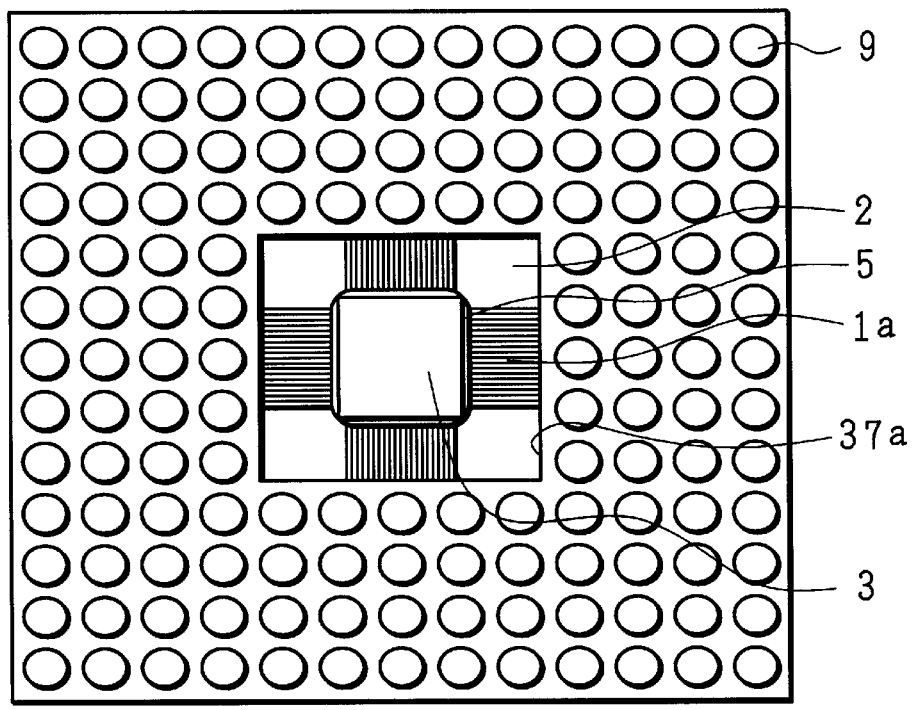
FIG. 9(a) is a plan view of the foregoing semiconductor device viewed from an external substrate side.
FIG. 9(b) is a plan view of the foregoing semiconductor device viewed from a radiating plate side.
Figure 9:
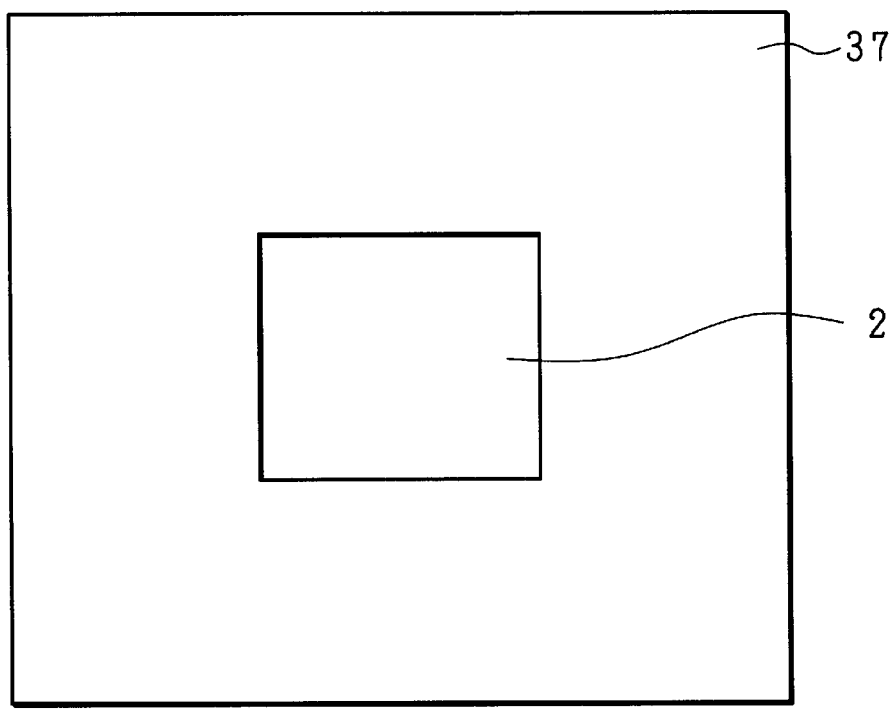

A semiconductor device in accordance with the present embodiment is, as shown in FIG. 8, arranged in the same manner as that in accordance with the first embodiment is, except that a radiating plate 37 (radiating member, first radiating member) having an opening 37a at a position corresponding to the semiconductor chip-installed region is used in the place of the radiating plate 7 (see FIG. 1), and that an underfill material 6 is used in the place of the anisotropic conductive material 5. Therefore, the radiating plate 37 in the present embodiment is the radiating plate 7 of the first embodiment from which the thinner portion thereof is omitted. The insulating tape 2 is bent so that the portion thereof corresponding to the semiconductor chip-installed region fits in the opening 37a. Incidentally, FIG. 9(*a*) is a plan view obtained by viewing the foregoing semiconductor device from the external substrate side (note that the external substrate 10 is omitted), and FIG. 9(*b*) is a plan view obtained by viewing the same semiconductor device from the radiating plate 37 side.

With this arrangement as well, more effective heat radiation can be realized since the radiating plate 37 is provided all over the solder ball-bonded regions, as compared with the conventional case in which a metal reinforcing plate in a frame shape is applied only on the periphery of the insulating tape. Besides, since the insulating tape 2 and/or the semiconductor chip 3 is positioned in the opening 37a, the semiconductor chip 3 is made to project less from the level of the radiating plate 37 toward the external substrate 10. Therefore, with the arrangement of the present embodiment, the same effect as that achieved by the first embodiment can be achieved.

With the arrangement of the first embodiment in which the recessed part 7a is formed, the depth of the recessed part 7a has to be adjusted in accordance with the projection of the semiconductor chip 3 from the level of the radiating plate 7 toward the external substrate 10 taken into consideration. In other words, for example, to make the semiconductor chip 3 project less, it is necessary to form the recessed part 7a deeper. In the present embodiment, however, such accurate depth adjustment is unnecessary since the opening 37a is formed instead of the recessed part 7a.

Furthermore, as to the arrangement in which the recessed part 7a is formed, the depth of the recessed part 7a needs to be adjusted in accordance with the depth of the semiconductor chip 3 so that the semiconductor chip 3 surely falls in the recessed part 7a, and for this purpose, the radiating plate 7 has to be thick to some extent. By contrast, in the present embodiment, the thickness of the radiating plate 37 can be reduced to such an extent as to be equal to the depth of the recessed part 7a. Therefore, the arrangement of the present embodiment allows the first radiating member to be formed thinner than that in the first embodiment, thereby further allowing the thinning of the package.

Furthermore, since the opening 37a is present but the radiating member is absent in the region facing the semiconductor chip 3, the present embodiment is inferior to the first embodiment in radiation of heat generated during operations of the device, but the absence of the radiating member causes less stress to be applied to the semiconductor chip 3, thereby ensuring suppression of package cracks.

The following description will explain methods of manufacturing the semiconductor device in accordance with the present embodiment. The semiconductor device of the present embodiment can be produced by any one of the following methods.

(First Manufacturing Method)

Figure 10:
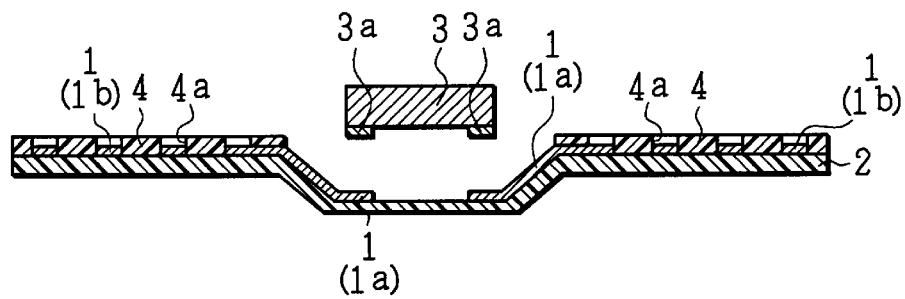
FIGS. 10(a) through 10(e) are cross-sectional views illustrating a manufacturing process in accordance with a first manufacturing method of the foregoing semiconductor device.
Figure 10:
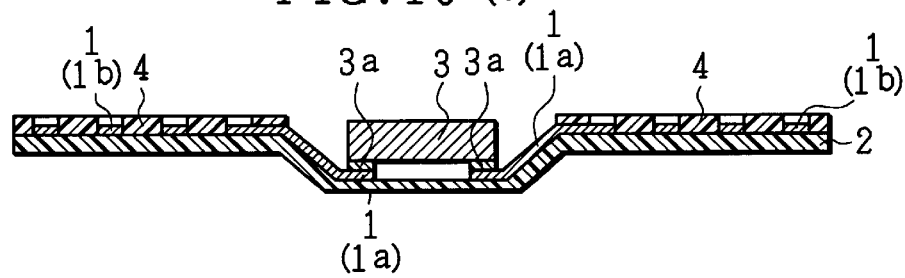
Figure 10:
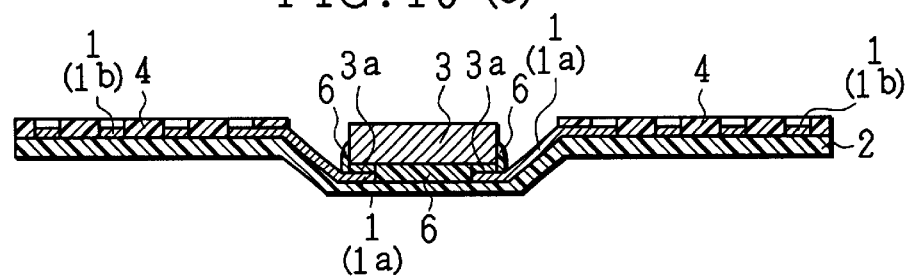
Figure 10:
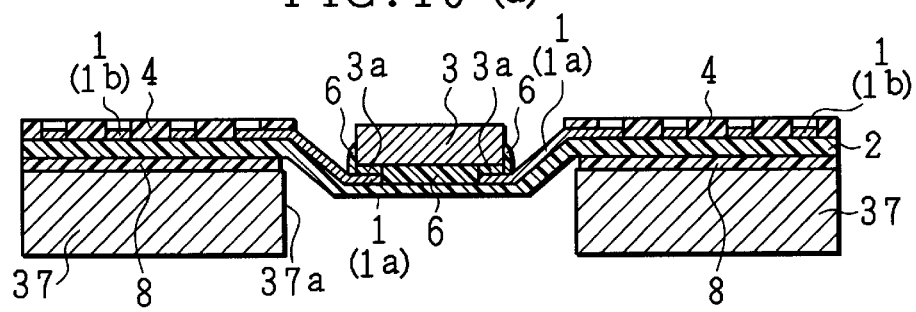
Figure 10:
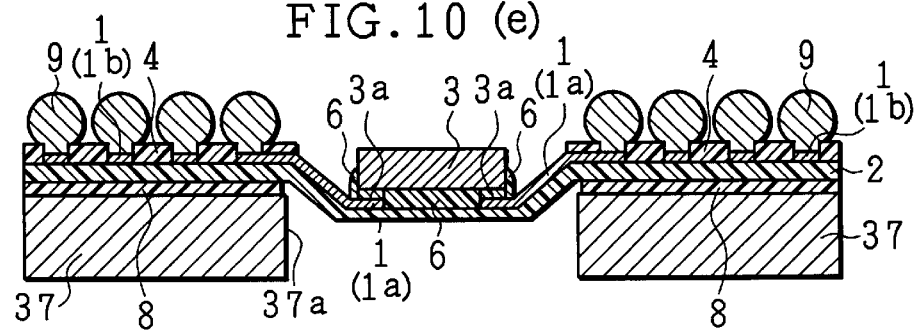
Figure 11:
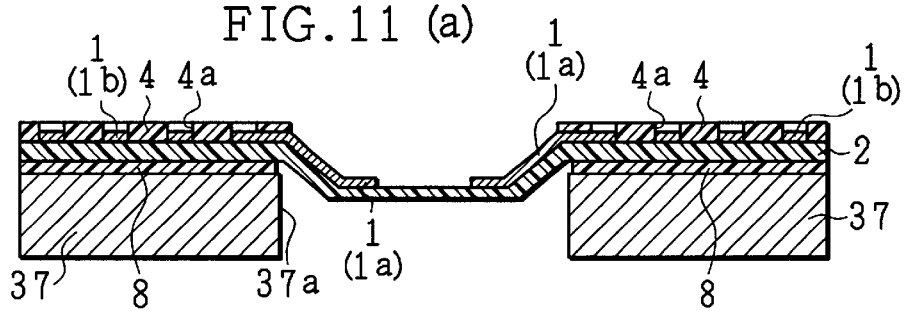
FIGS. 11(a) through 11(e) are cross-sectional views illustrating a manufacturing process in accordance with a second manufacturing method of the foregoing semiconductor device.
Figure 11:
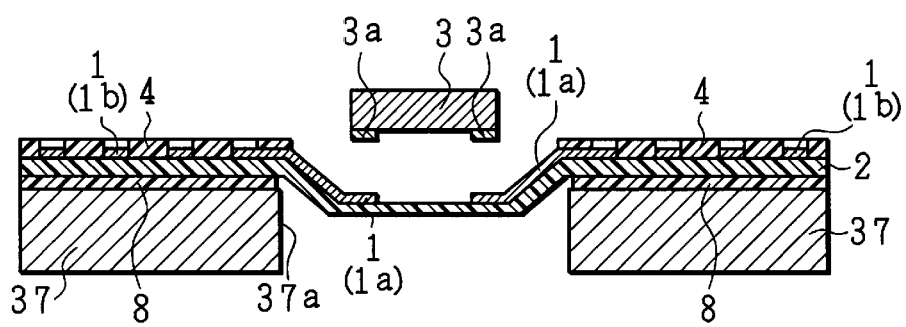
Figure 11:
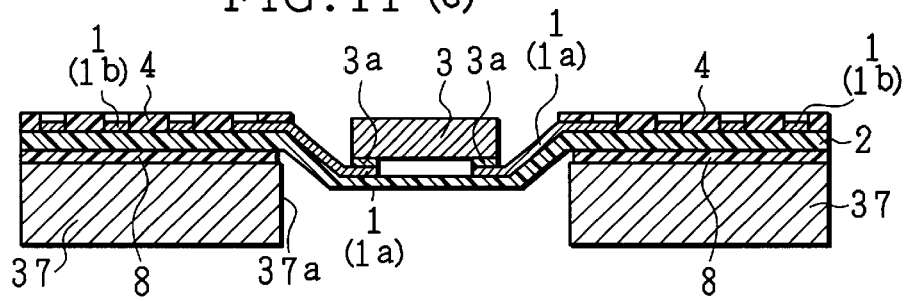
Figure 11:
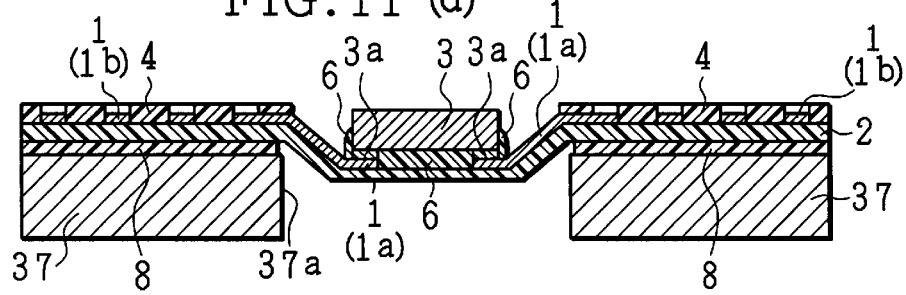
Figure 11:
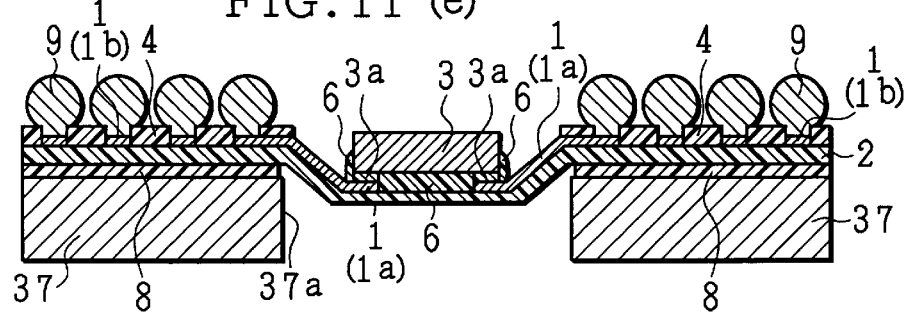

First, as shown in FIGS. 10(*a*) and 10(*b*), a conductive pattern composed of the inner lead 1a and the outer lead 1b is formed only on the insulating tape 2, and thereafter, the inner lead 1a on the insulating tape 2 and the bump 3a of the semiconductor chip 3 are subjected to heat and pressure so as to transform into solid solution thereby forming an alloy, so that they are connected to each other. Next, a protective film 4 is formed on the lead 1 on the surface of the insulating tape 2 except a portion thereof connected with the bump 3a and a solder ball-bonded region thereof. In other words, the protective film 4 is formed so as to cover at least the outer lead 1b of the lead 1. Apertures 4a are formed in the protective film 4 at respective positions corresponding to the solder balls 9 to be formed.

Subsequently, as shown in FIG. 10(c), an underfill material 6 is applied so as to protect the element-formed surface of the semiconductor chip 3 and the inner lead 1a. Then, as shown in FIG. 10(d), the radiating plate 37 formed so as to cover at least the entire solder balls 9-formed region is made to adhere to the back surface (a surface on a side opposite to the lead-formed surface side) of the insulating tape 2 with use of the adhesive 8.

Figure 20:
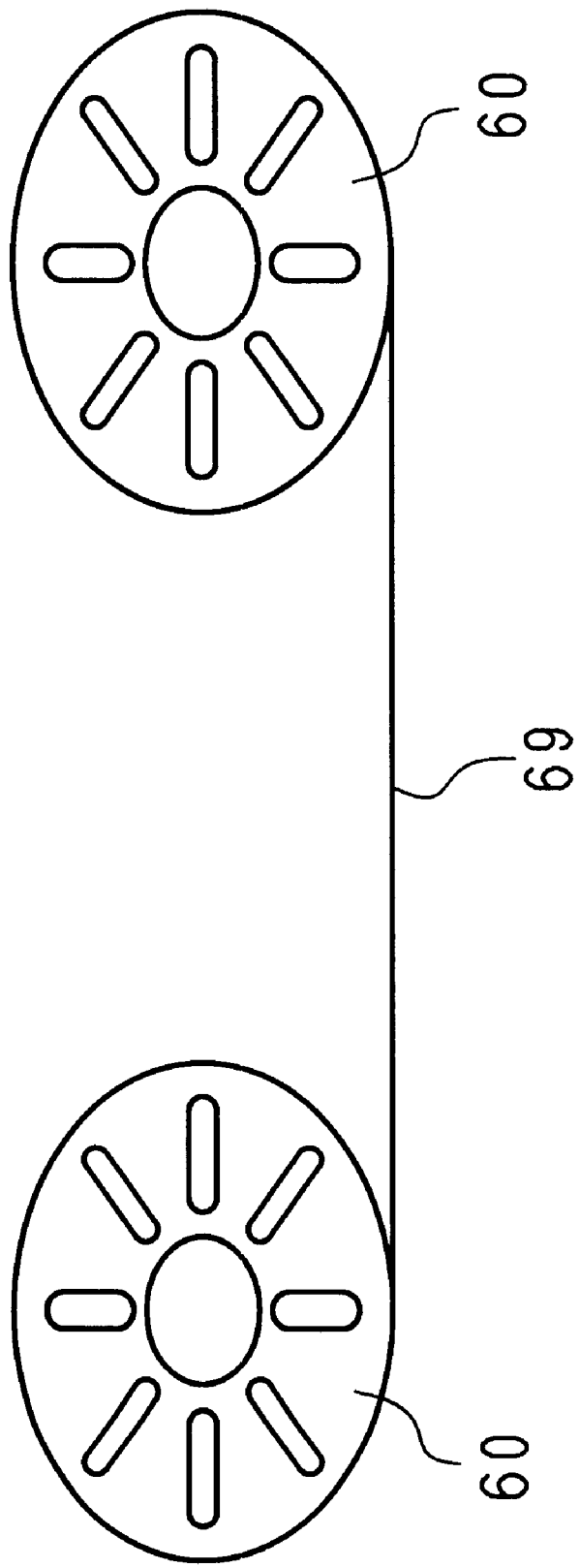
FIG. 20 is a side view illustrating reels used in manufacture of the foregoing semiconductor device, around which a tape composed of insulating tapes continuously formed is wound.
Figure 21:
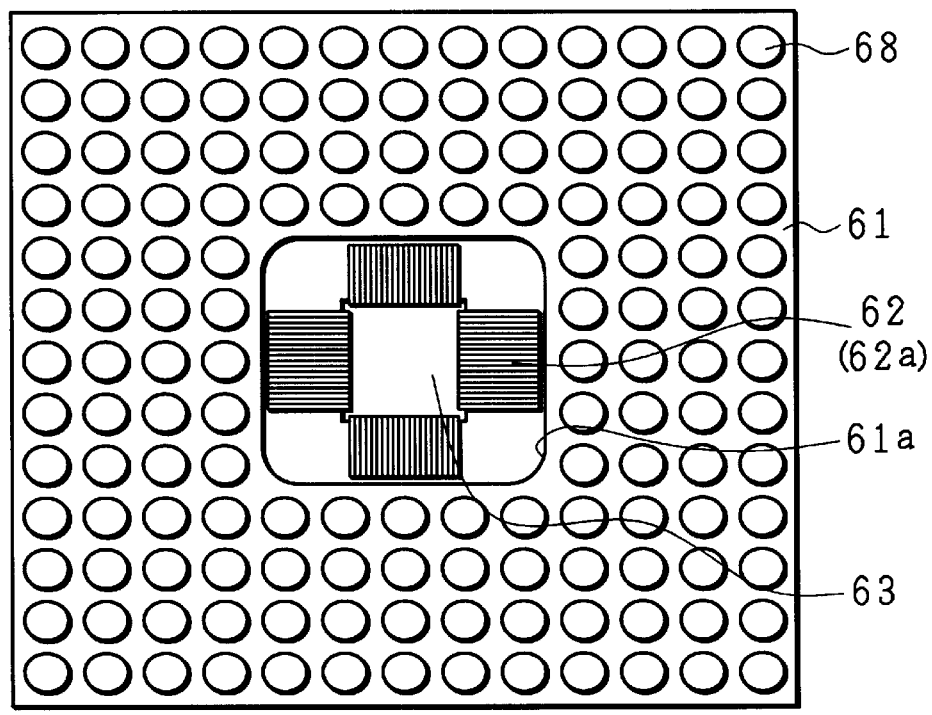
FIG. 21(a) is a plan view of the foregoing semiconductor device viewed from an external substrate side.
FIG. 21(b) is a plan view of the foregoing semiconductor device viewed from the metal reinforcing plate side.
Figure 21:
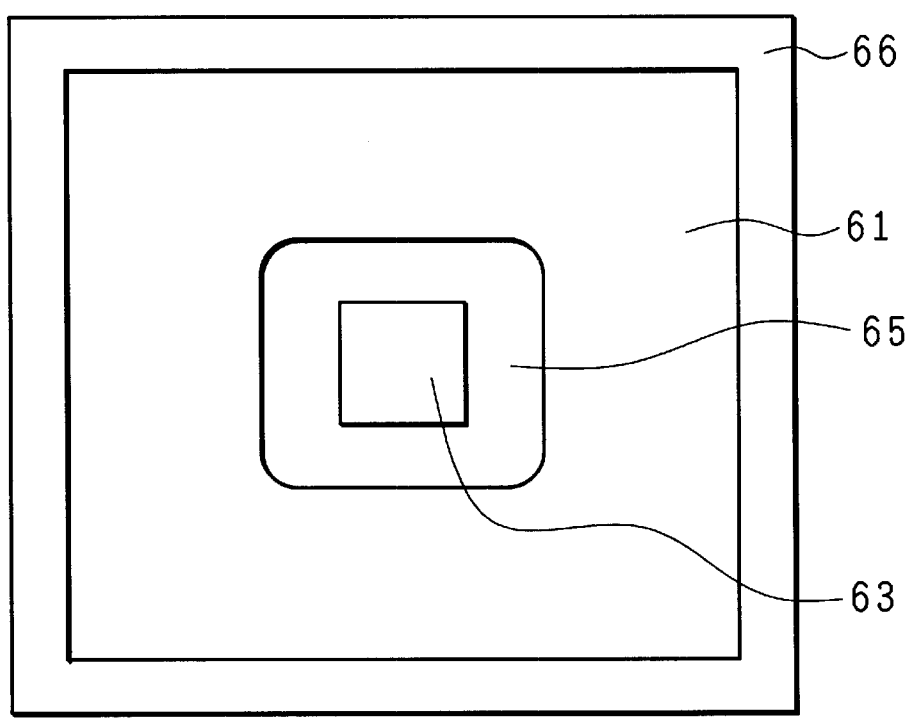
Figure 22:
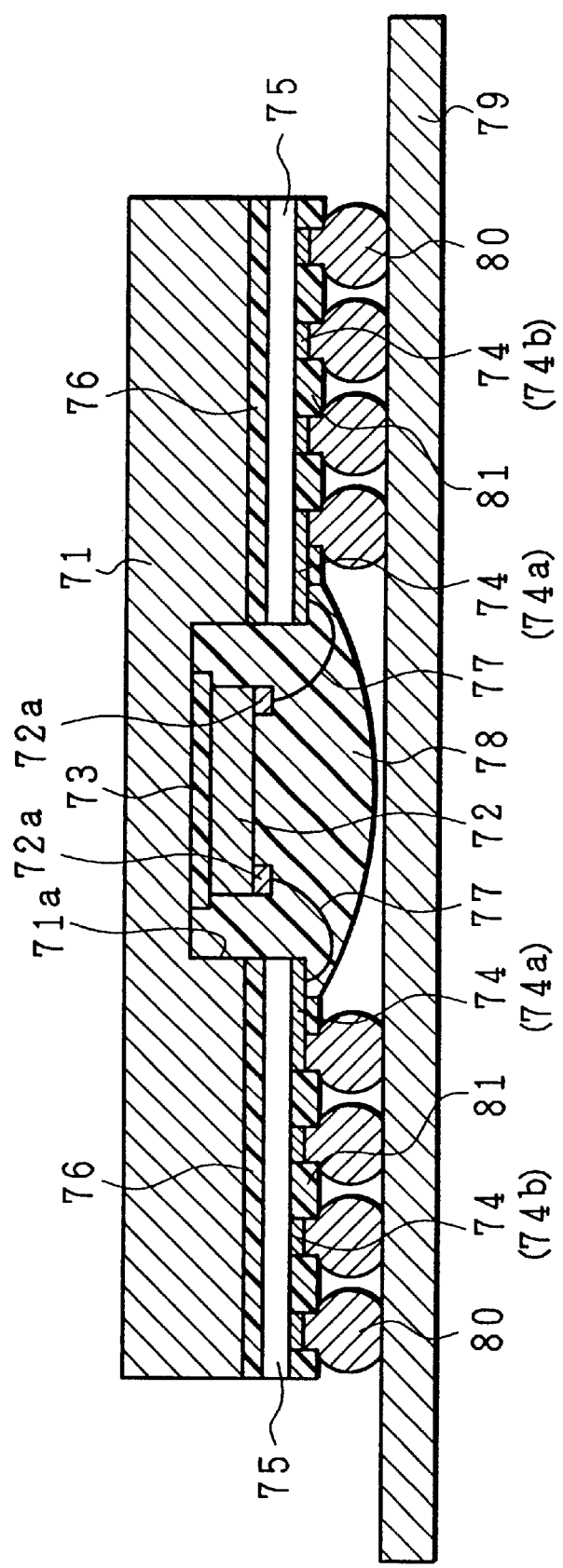
FIG. 22 is a cross-sectional view illustrating a schematic arrangement of a conventional semiconductor device of the wire bonding type.

Finally, as shown in FIG. 10(e), the solder balls 9 are formed at the apertures 4a of the protective film 4, so that the outer lead 1b and the external substrate 10 (see FIG. 8) are bonded to each other through the solder balls 9. In the case of the present manufacturing method, like in the conventional case, the foregoing process is carried out in a continuous manner by, for example, a method with use of reels 60 shown in FIG. 20. In other words, a device used in the conventional manufacturing process can be used without revision, to manufacture the packages.

(Second Manufacturing Method)

First, as shown in FIG. 11(a), a conductive pattern composed of the inner lead 1a and the outer lead 1b is formed only on the insulating tape 2, and thereafter, the radiating plate 37 which covers at least all the solder ball 9-formed regions is made to adhere to a back surface of the insulating tape 2 (surface on a side opposite to the lead formed surface side) by means of the adhesive 8. Then, the insulating tape 2 is subjected to pressure so that a part of the insulating tape 2 corresponding to the semiconductor chip-installed region falls in the opening 37a of the radiating plate 37. Next, a protective film 4 is formed on the lead 1 on the surface of the insulating tape 2 except a portion thereof connected with the bump 3a of and a solder ball-bonded region thereof. In other words, the protective film 4 is formed so as to cover at least the outer lead 1b of the lead 1. Apertures 4a are formed in the protective film 4 at respective positions corresponding to the solder balls 9 to be formed.

Next, as shown in FIGS. 11(b) and 11(c), such an eutectic state as described above is created between the inner lead 1a on the insulating tape 2 and the bump 3a of the semiconductor chip 3 so as to be connected with each other, in a manner such that the insulating tape 2 and the element-formed surface of the semiconductor chip 3 face each other. Subsequently, as shown in FIG. 11(d), the underfill material 6 is applied so as to protect the element-formed surface of the semiconductor chip 3 and the inner lead 1a.

Thereafter, as shown in FIG. 11(e), the solder balls 9 are formed at the apertures 4a of the protective film 4, so that the outer lead 1b and the external substrate 10 (see FIG. 8) are bonded to each other through the solder balls 9.

The semiconductor device in accordance with the present embodiment is not prone to deformation of the lead 1 or the like during the manufacturing process, since the lead 1 is made to adhere to the insulating tape 2. Therefore, it is possible to earlier carry out a step that relatively tends to apply stress to the insulating tape 2, or more specifically, to bond the insulating tape 2 and the radiating plate 37 before the semiconductor chip 3 and the inner lead 1a are bonded. Such a method does not lower the yield of packages.

Therefore, conventionally the manufacture by the second manufacturing method was impossible on account of the inner lead wiring, but the present embodiment allows the second manufacturing method to be selectable to form packages, thereby broadening the range of options available.

(Third Manufacturing Method)

Figure 12:
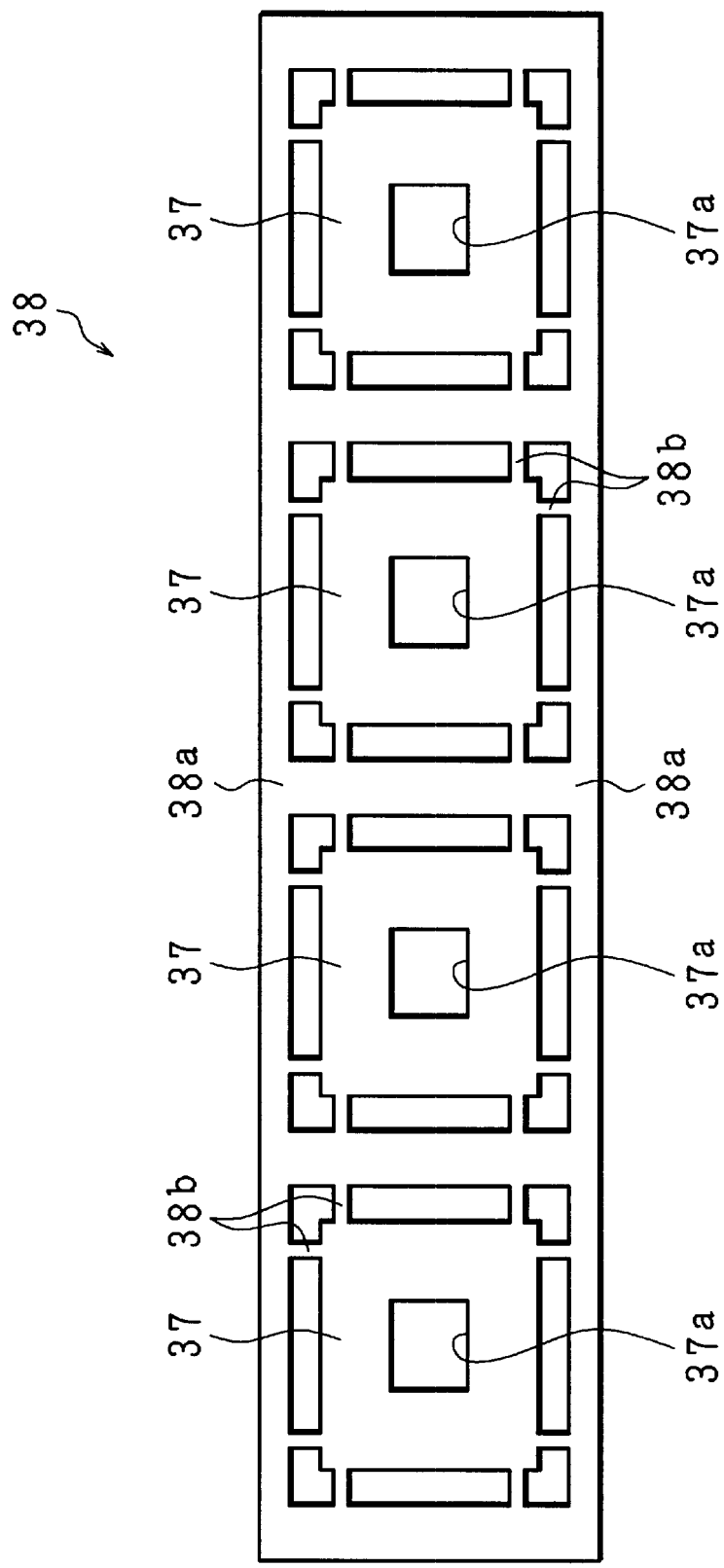
FIG. 12 is a plan view illustrating a lead frame which is used in a third manufacturing method of the foregoing semiconductor device, and has a plurality of regions serving as radiating plates.

First, as shown in FIG. 12, a lead frame 38 having a plurality of regions (radiating regions) serving as the radiating plates 37 having the opening 37a each is formed. Incidentally, the radiating regions are formed so as to cover at least the regions where the solder balls 9 are formed. Side edges of each radiating plate 37 are connected to outer frames 38a of a lead frame 38 through connecting sections 38b of the same. Here, one lead frame 38 is arranged so as to include four radiating plates 37, but the number is not limited to this.

Next, as shown in FIG. 13(a), the insulating tape 2, having on its surface the protective film 4 which has the apertures 4a at respective positions corresponding to the solder balls 9 to be formed, is applied to each radiating plate 37 in a manner such that a surface of the insulating tape 2 on a side opposite to the conductive pattern-formed surface side is brought into contact with the radiating plate 37. Then, as shown in FIG. 13(b), at each radiating plate 37, in the same manner as described above, an eutectic state is created between the inner lead 1a on the insulating tape 2 and the bump 3a of the semiconductor chip 3 so as to be connected with each other. Thereafter, the underfill material 6 is applied so as to cover the element-formed surface of the semiconductor chip 3 and the inner lead 1a.

Figure 14:
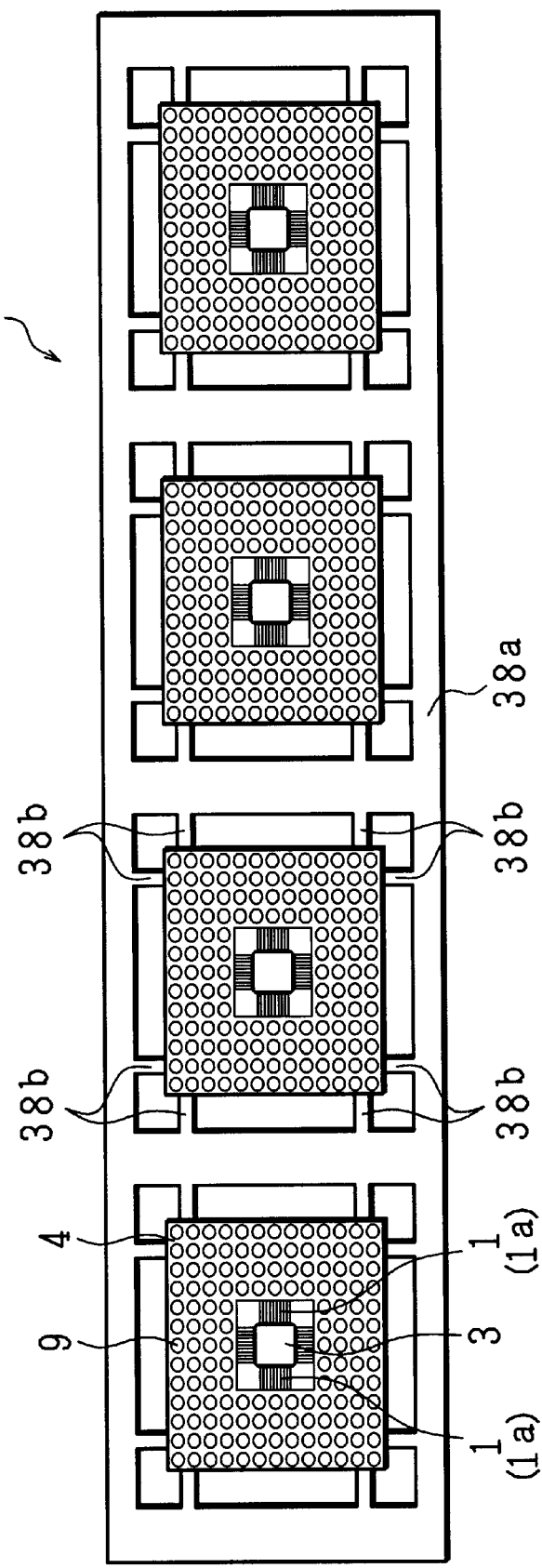
FIG. 14(a) is a plan view illustrating a lead frame in a state in which a solder ball is formed at each aperture of a protective film.
FIG. 14(b) is a plan view illustrating one semiconductor device cut out of the lead frame.
Figure 14:
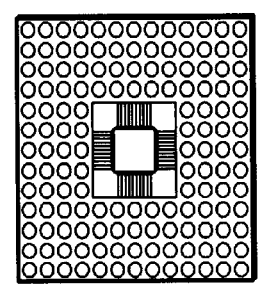

Subsequently, as shown in FIG. 14(a), the solder balls 9 are formed at the apertures 4a, so that the outer leads of each insulating tape 2 and the solder balls 9 are connected. Finally, as shown in FIG. 14(b), the connecting sections 38b are cut off, whereby each TBGA 39 is taken out of the lead frame 38. Thereafter, each TBGA 39 is connected to a predetermined external substrate through the solder balls 9.

Thus, by the third manufacturing method, several chips can be manufactured at once. Therefore, this method has no difference from the foregoing method in that the inner lead 1a and the semiconductor chip 3 are bonded after the radiating plate 37 and the insulating tape 2 are made to adhere to each other, while the third manufacturing method enjoys a higher manufacturing efficiency as compared with the second manufacturing method wherein each chip is individually manufactured.

According to the foregoing manufacturing methods, the inner lead 1a and the bump 3a are bonded in the eutectic state, but the both may be bonded through an anisotropic conductive material 5 as shown in FIGS. 2(a) and 2(b). In this case, the semiconductor chip 3 and the inner lead 1a can be bonded with each other at a lower temperature, and hence, damages to the insulating tape 2 can be avoided, while damages to the semiconductor chip 3 can be reduced. As a result, the reliability of package can be enhanced. In the case where the anisotropic conductive material 5 is used, the anisotropic conductive material 5 serves as the underfill material also, thereby making the underfill material applying step unnecessary. Therefore, the manufacturing process is simplified, and improvement of the package manufacturing efficiency and the lowering of costs of packages can be achieved.

Incidentally, the insulating tape 2 preferably has a recessed portion so as to fit in the opening 37a as in the present embodiment, but in the case where it is possible to make the semiconductor chip 3 project less by polishing the back surface of the semiconductor chip 3, the insulating tape 2 may be made to adhere in a flat state to the radiating plate 37, without being bent as in the present embodiment.

The foregoing first through third manufacturing methods are applicable to not only the semiconductor device in accordance with the present embodiment but also the aforementioned semiconductor device in accordance with the first embodiment and semiconductor devices described hereinafter in the descriptions of the third and fourth embodiments.

[Third Embodiment]

Figure 15:
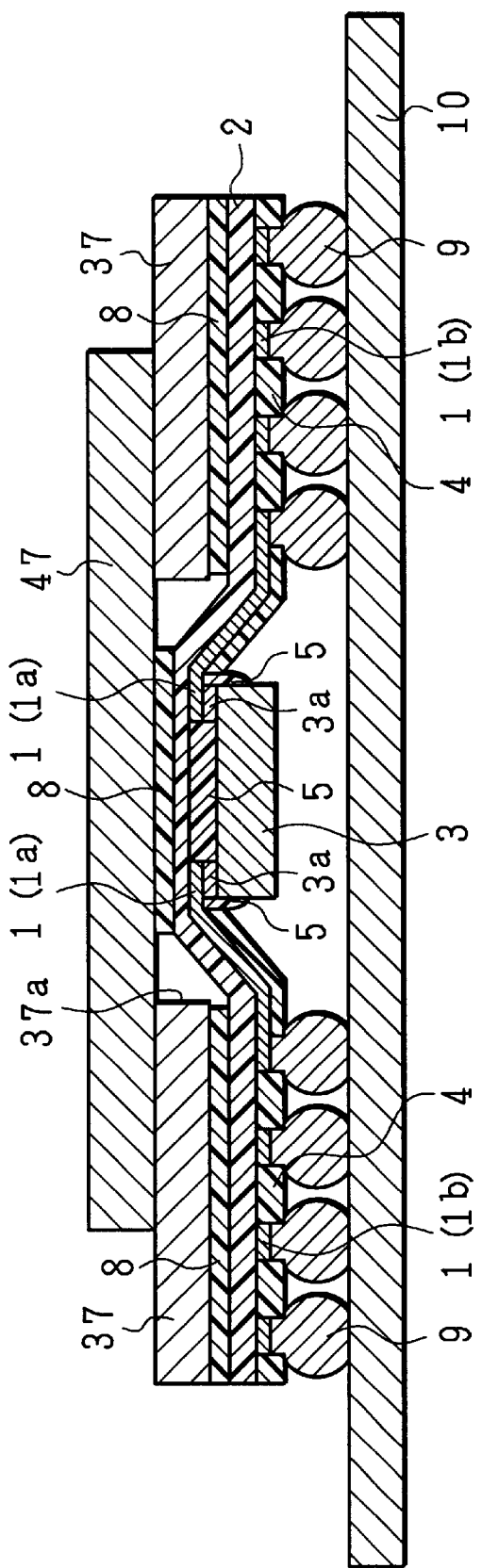
FIG. 15 is a cross-sectional view illustrating a schematic arrangement of a semiconductor device in accordance with still another embodiment of the present invention.

The following description will explain another embodiment of the present invention, while referring to FIG. 15. Incidentally, the members having the same structure (function) as those in the first and second embodiments will be designated by the same reference numerals and their description will be omitted.

A semiconductor device in accordance with the present embodiment is, as shown in FIG. 15, the semiconductor device in accordance with the second embodiment which is further provided with a radiating plate 47 (second radiating member) in a flat plate state with a uniform thickness. The radiating plate 47 is provided on a side of the radiating plate 37 opposite to the insulating tape adhering side, so as to close the opening 37a of the radiating plate 37 as the first radiating member. The radiating plate 47 and the insulating tape 2 facing the same are made to adhere to each other with the adhesive 8. Incidentally, in the present embodiment, the anisotropic conductive material 5 is used in the place of the underfill material 6.

The radiating plates 37 and 47 are made of, for example, a metal such as copper which is relatively easily processed, and are desirably formed to a thickness of not greater than about 250 μm each so that desired flatness and strength are ensured.

With this arrangement wherein the radiating plate 47 is provided vis-a-vis the semiconductor chip 3, it is possible to surely emit heat generated during operations of the device, through the radiating plate 47 to outside. Needless to say, heat generated during respective steps of the manufacturing process and during the installing step can be emitted through at least the radiating plate 37.

Further, since the opening of the radiating plate 37 is closed by the radiating plate 47, impact and the like is not directly applied from outside to the semiconductor chip 3 located in the opening 37a. As a result, the semiconductor chip 3 is surely protected. Further, the radiating plates 37 and 47 consequently form a semiconductor chip-installed recessed region, and therefore such a recessed structure can be more easily obtained as compared with the first embodiment in which a recess is formed in one radiating member. As a result, simplification of the manufacturing process and the reduction of manufacturing costs can be easily achieved.

[Fourth Embodiment]

Figure 16:
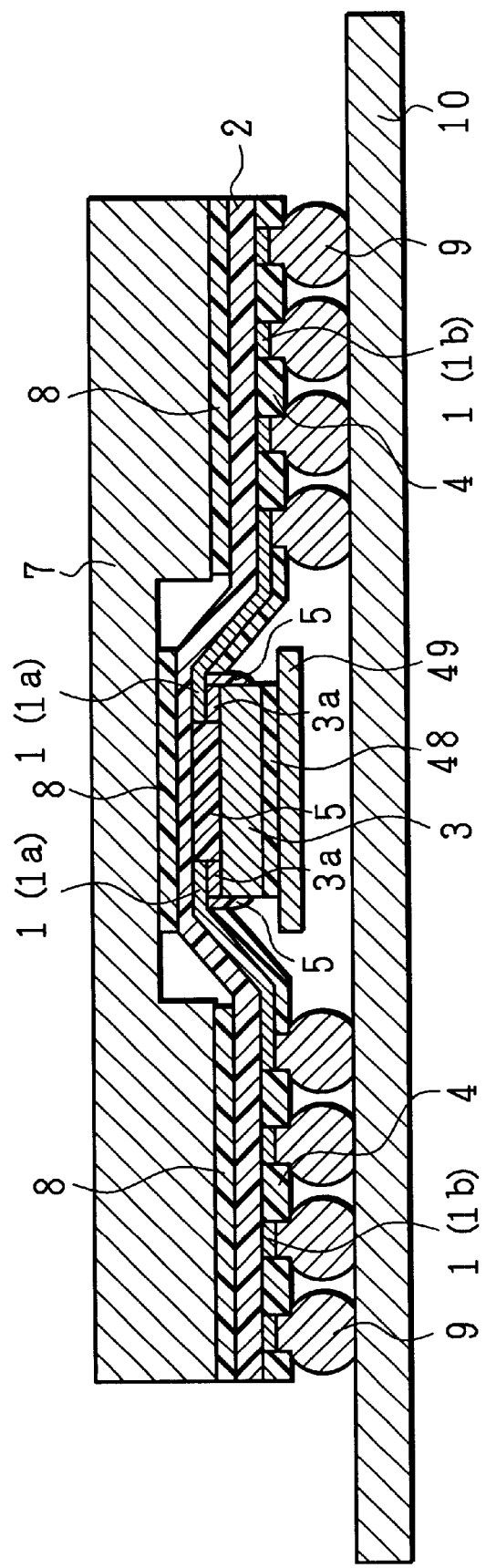
FIG. 16 is a cross-sectional view illustrating a schematic arrangement of a semiconductor device in accordance with still another embodiment of the present invention.
Figure 17:
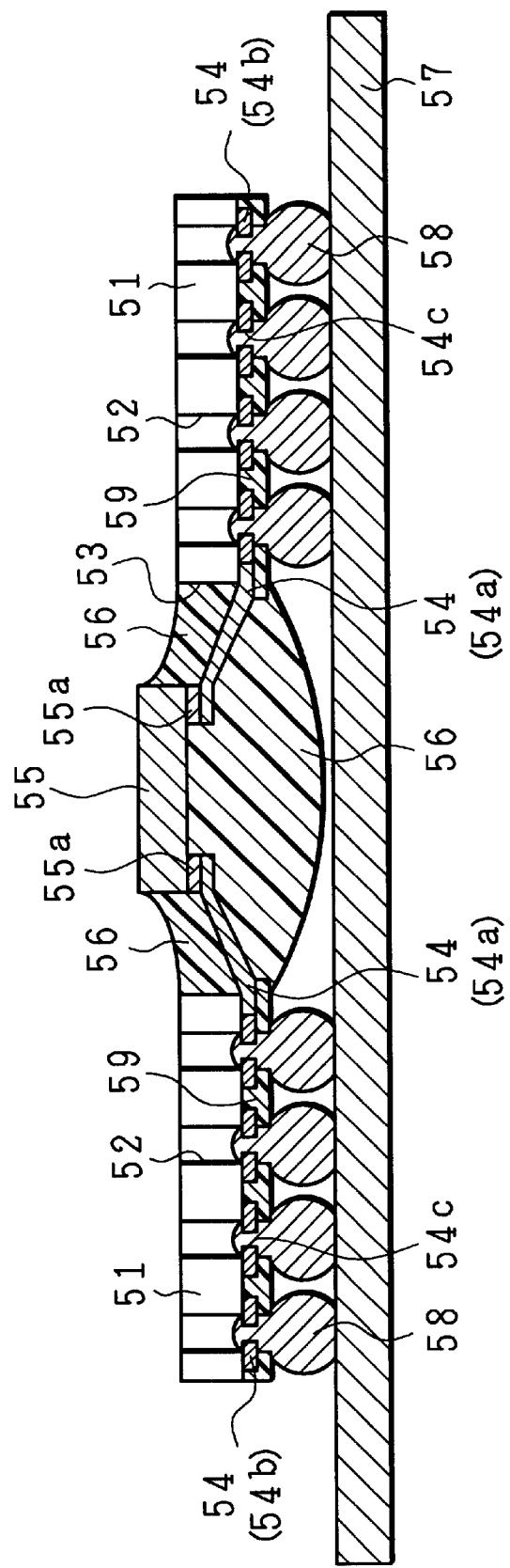
FIG. 17 is a cross-sectional view illustrating a schematic arrangement of a conventional semiconductor device o f the TAB type.
Figure 18:
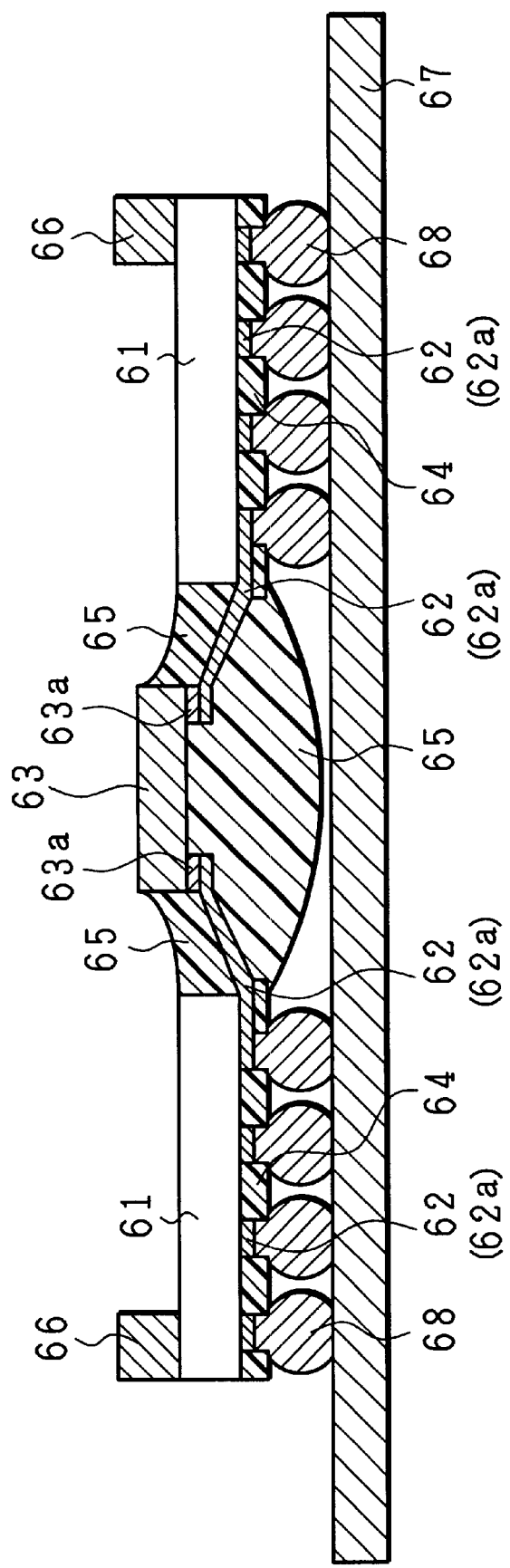
FIG. 18 is a cross-sectional view illustrating a schematic arrangement of a conventional semiconductor device of the TAB type in which a frame-shaped metal reinforcing plate is applied to a surface of an insulating tape on a side opposite to a conductive pattern-formed surface side.
Figure 19:
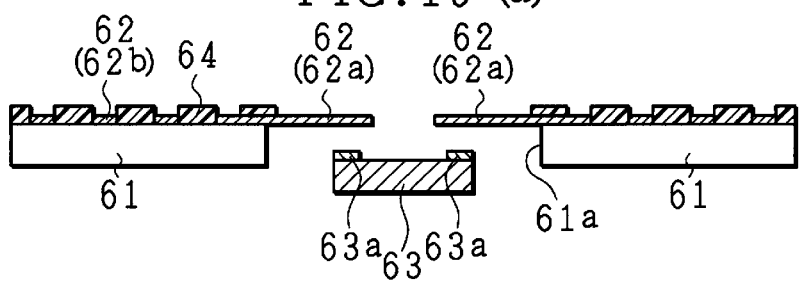
FIGS. 19(a) through 19(e) are cross-sectional views illustrating a manufacturing process of the foregoing semiconductor device.
Figure 19:
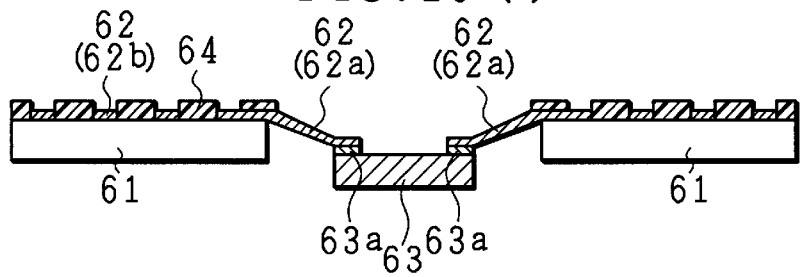
Figure 19:
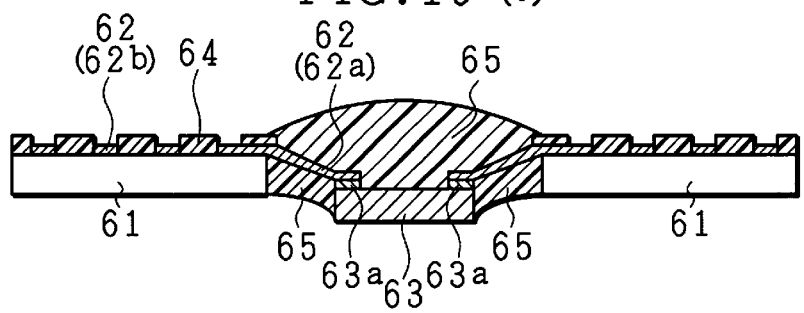
Figure 19:
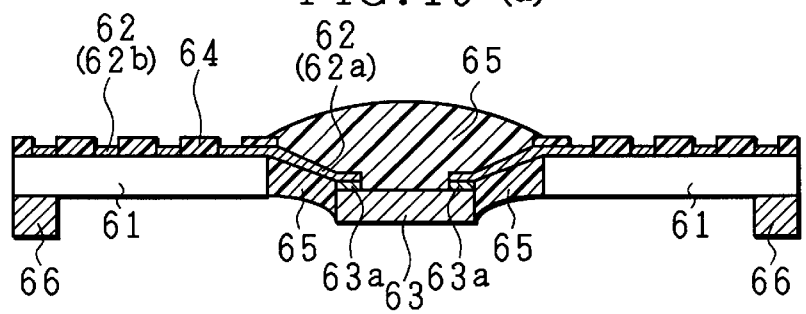
Figure 19:
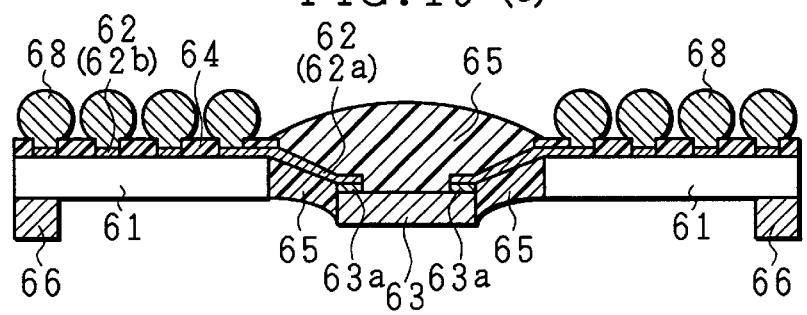

The following description will explain another embodiment of the present invention, while referring to FIG. 16. Incidentally, the members having the same structure (function) as those in the first through third embodiments will be designated by the same reference numerals and their description will be omitted.

A semiconductor device in accordance with the present embodiment is, as shown in FIG. 16, the semiconductor device of the first embodiment which is further arranged so that a heat sink 49 (third radiating member) with a heat radiating property is fixed to a back surface of the semiconductor chip 3.

The heat sink 49 is made of a metal excelling in heat conductivity, such as copper, and is fixed to the back surface of the semiconductor chip 3 with an adhesive 48 excelling in heat conductivity, such as silver paste. Incidentally, since this arrangement results in that the semiconductor chip 3 projects from the radiating plate 7 the more for the thickness of the heat sink 49, it is desirable that the heat sink 49 is formed as thin as possible.

The foregoing arrangement including the heat sink 49 has a drawback in that an increase in the package thickness, which is an obstruct to the attempt of making the semiconductor device smaller, and the drawback may more or less lead to disadvantage of the semiconductor device. The foregoing arrangement, however, has an advantage in that the heat generated during operations of the device can be emitted through the heat sink 49 to outside, and this ensures more efficient heat radiation which is a property required in order to achieve high integration and excellent performance of the device. In other words, the present arrangement can easily meet the demand for high integration and excellent performance of the device.

Incidentally, the above description of the present embodiment explains an example in which the heat sink 49 is provided in the semiconductor device of the first embodiment, but likewise the heat sink 49 can be applied to the semiconductor devices of the second and third embodiments.

As has been described above, a semiconductor device of the present invention, which is a semiconductor device of a film carrier-type having external connection terminals in a protuberance form each, may be arranged so as to include (i) a conductive pattern composed of an inner lead section and an outer lead section, the conductive pattern being provided only on an insulating tape, (ii) a plurality of external connection terminals in a protuberance form each, each being connected with the outer lead section at an opening of a protective film, the protective film being formed so as to cover at least the outer lead section of the conductive pattern, (iii) an integrated circuit chip bonded with the inner lead section so that an element-formed surface of the integrated circuit chip faces the insulating tape, and (iv) a first radiating member with a heat radiating property, provided on a surface of the insulating tape on a side opposite to a conductive pattern-formed side thereof so as to cover at least all regions where the external connection terminals are formed.

With the foregoing arrangement in which the inner lead section is formed only on the insulating tape, the inner lead section is never uncovered with the insulating tape. In other words, the inner lead section as a whole is supported by the insulating tape. This ensures that deformation due to stress during manufacture is prevented from easily occurring to the inner lead section, thereby resulting in that package defects resulting on the foregoing stress are prevented.

Furthermore, since the first radiating member is formed on the surface of the insulating tape, it is possible to efficiently and surely emit heat generated during respective steps of the semiconductor device manufacturing process and during the installing step to outside through the first radiating member.

More specifically, in the case of the conventional package equipped with the frame-shaped metal reinforcing plate, an effect of emitting heat of the insulating tape is poor since heat radiation by the metal reinforcing plate is effective only partially with respect to the insulating tape surface. In the foregoing arrangement, however, wherein the first radiating member is formed so as to cover at least all regions where the external connection terminals are formed, the first radiating member has a surface incomparably larger than the metal reinforcing plate, and is capable of surely emitting heat of the entire insulating tape. Moreover, in the case where, for example, another first radiating member is provided at a position vis-a-vis the integrated circuit chip, heat generated during operations of the device can be emitted through the first radiating member.

Thus, the foregoing arrangement produces a remarkably excellent radiating effect as compared with the conventional cases, thereby ensuring that damages to the insulating tape and the integrated circuit chip by heat generated during the manufacturing process and during operations of the device are surely avoided. As a result, package defects resulting on the foregoing heat can be surely reduced.

Furthermore, the integrated circuit chip is bonded with the inner lead section formed only on the insulating tape through a pressing operation. This bonding method, which is called as "flip chip method," does not require a metal wire for bonding the integrated circuit chip with the inner lead section which is required in the wire bonding method, and therefore the pitch narrowing and the formation of the multi-port structure are facilitated. Besides, since to form the inner lead sections at narrower spaces on the insulating tape is easier, the foregoing arrangement is particularly effective for the pitch narrowing.

Furthermore, packages formed by the wire bonding method cannot help becoming thick since resin sealing is applied so as to cover the wires, whereas packages formed by the foregoing arrangement are formed thinner as compared with those formed by the wire bonding method, since such wires are unnecessary.

The semiconductor device of the present invention may be further arranged so that each external connection terminal is in a spherical shape.

The foregoing arrangement ensures that such advantages can be achieved as easier formation and easier control on the size of each external connection terminal as compared with the cases of forming it into another solid shape.

The semiconductor device of the present invention may be further arranged so that a recess or an opening is formed in the first radiating member, and the insulating tape is bent so that the integrated circuit chip is positioned in the recess or the opening.

With the foregoing arrangement, the integrated circuit chip bonded with the inner lead section on the insulating tape surface, since being positioned in the recess or the opening, projects less from the level of the first radiating member. As a result, the package can be formed further thinner.

Furthermore, in the case where the external connection terminals are formed with ball-like terminals such as solder balls, the diameter of the ball-like terminals is regulated according to the extent to which the integrated circuit chip projects from the first radiating member, but in the foregoing arrangement, since the projection can be reduced, the ball diameter can be made the smaller for the reduction of projection. Therefore, the thinning of the package and the formation of the multi-port structure are further facilitated, while it is possible to meet such requirement as formation of fine patterns.

The semiconductor device of the present invention may be further arranged so that the first radiating member has a uniform thickness and is bent so as to have a level difference in a thickness direction so that the recess is formed.

With the foregoing arrangement, a surface of the first radiating member on a side opposite to the insulating tape side becomes larger as compared with the case where the first radiating member is in a flat plate form. Therefore, a further greater radiating effect can be achieved.

Furthermore, in the case where a recess is formed in the first radiating member in a flat plate form, the recess is usually formed by, for example, the etching method which is a common processing method, but in the foregoing arrangement the recess is formed not by the etching method but by simply bending the flat plate-shaped first radiating member. Therefore, chemicals required in etching are unnecessary in the foregoing arrangement, resulting in that the recess can be formed more easily than it is formed by etching.

The semiconductor device of the present invention may be further arranged so as to further include a second radiating member with a heat radiating property, provided so as to close the opening of the first radiating member.

With the foregoing arrangement wherein the second radiating member is present facing the integrated circuit chip, head generated during operations of the device can be emitted to outside through the second radiating member.

Moreover, since the opening of the first radiating member is closed by the second radiating member, impact and the like is not directly applied from outside to the integrated circuit chip located in the opening. As a result, the integrated circuit chip is surely protected. Further, the first and second radiating members consequently form a integrated circuit chip-installed recessed region, and therefore such a recessed structure can be more easily obtained as compared with the case where a recess is formed in one radiating member. With this, simplification of the manufacturing process can be easily achieved, which results in reduction of manufacturing costs.

The semiconductor device of the present invention may be further arranged so that a portion of the insulating tape corresponding to an integrated circuit chip-installed region is fixed to the first or second radiating member.

With the foregoing arrangement, deformation of the insulating tape and the inner lead section on the insulating tape surface is surely prevented, thereby resulting in that the integrated circuit chip bonded with the inner lead section can be stably installed. Besides, heat is surely transmitted from the insulating tape to the first or second radiating member, whereby the radiating effect is further enhanced.

The semiconductor device of the present invention may be further arranged so that the integrated circuit chip is bonded with the inner lead section through an anisotropic conductive material, and that the anisotropic conductive material serves as a protective member protecting at least the element-formed surface of the integrated circuit chip.

With the foregoing arrangement, the integrated circuit chip and the inner lead section can be bonded with each other at a lower temperature as compared with the case where they are bonded in an eutectic state, and hence, damages to the insulating tape can be avoided, while damages to the integrated circuit chip at the bonding step can be reduced. As a result, the reliability of the device can be enhanced.

Moreover, since the bonding between the inner lead section and the integrated circuit chip and the protection of the element-formed surface can be achieved with the one and same material through the one and same step, the improvement of the manufacturing efficiency and the lowering of manufacturing costs can be achieved.

The semiconductor device of the present invention may be further arranged so as to further include a third radiating member with a heat radiating property, provided on a surface of the integrated circuit chip on a side opposite to an element-formed side thereof.

The foregoing arrangement ensures that heat generated during operations of the device can be emitted to outside through the third radiating member, thereby easily meeting the demand for high integration and excellent performance of the device.

A method for manufacturing a semiconductor device in accordance with the present invention, which is a method for manufacturing a semiconductor device of a film carrier-type having external connection terminals in a protuberance form each, may be arranged so that, (i) first, an insulating tape is caused to adhere to a radiating member, with a surface of the insulating tape on a side opposite to a conductive pattern-formed side thereof being in contact with the radiating member, so that the radiating member covers all regions where external connection terminals are formed, the external connection terminals each being in a protuberance form and being connected through an aperture of a protective film with an outer lead section of a conductive pattern which is composed of the outer lead section and an inner lead section and is provided only on an insulating tape, the protective film being formed so as to cover at least the outer lead section of the conductive pattern, and (ii) thereafter, the inner lead section and the integrated circuit chip are bonded so that an element-formed surface of the integrated circuit chip faces the insulating tape.

By the foregoing method, since the conductive pattern is formed only on the insulating tape, the conductive pattern is not prone to deformation in the middle of the manufacturing process. Therefore, the foregoing arrangement allows the step of bonding the insulating tape to the radiating member, which step relatively tends to apply stress on the insulating tape, to be conducted before the step of bonding the integrated circuit chip with the inner lead section; such manufacturing process has conventionally been infeasible since the inner lead section was formed partially outside the insulating tape. Accordingly, the foregoing manufacturing method has become selectable as a method to form the semiconductor device manufacturing method, thereby broadening the range of available manufacturing methods.

Furthermore, unlike a semiconductor device of the TAB type, a step of providing a device hole in the insulating tape for installation of an integrated circuit chip is unnecessary, thereby resulting in that the device manufacturing process is simplified.

A method for manufacturing a semiconductor device in accordance with the present invention, which is a method for manufacturing a semiconductor device of a film carrier-type having external connection terminals in a protuberance form each, may be arranged so that, (i) first, an inner lead section of a conductive pattern on an insulating tape is bonded with an integrated circuit chip so that an element-formed surface of the integrated circuit chip faces the insulating tape, the conductive pattern being composed of the inner lead section and an outer lead section and being provided only on the insulating tape, and (ii) thereafter, the insulating tape is caused to adhere to a radiating member, with a surface of the insulating tape on a side opposite to a conductive pattern-formed side thereof being in contact with the radiating member, so that the radiating member covers all regions where external connection terminals are formed, the external connection terminals each being in a protuberance form and being connected through an aperture of a protective film with the outer lead section of the conductive pattern, the protective film being formed so as to cover at least the outer lead section of the conductive pattern.

According to the foregoing method, the integrated circuit chip is bonded with the inner lead section before the insulating tape is bonded with the radiating member. Therefore, it is possible to perform the integrated circuit chip-inner lead section bonding step with respect to a plurality of chips simultaneously, by using a tape in which insulating tapes for a plurality of chips are continuously formed. This method enables improvement of the throughput of the semiconductor device.

Furthermore, unlike a semiconductor device of the TAB type, a step of providing a device hole in the insulating tape for installation of an integrated circuit chip is unnecessary, thereby resulting in that the device manufacturing process is simplified.

A method for manufacturing a semiconductor device in accordance with the present invention, which is a method for manufacturing a semiconductor device of a film carrier-type having external connection terminals in a protuberance form each, may be arranged so as to include the steps of (i) forming a lead frame including a plurality of radiating regions formed so as to cover at least all regions where a plurality of external connection terminals each in a protuberance form are provided, (ii) causing an insulating tape having a conductive pattern thereon to adhere to each radiating region, with a surface of the insulating tape on a side opposite to a conductive pattern formed-surface being in contact with the radiating region, the conductive pattern of the insulating tape being composed of an inner lead section and an outer lead section, the insulating tape having a protective film covering at least the outer lead section, (iii) bonding the integrated circuit chip with the inner lead section so that an element-formed surface of the integrated circuit chip faces the insulating tape, (iv) connecting each external connection terminal in the protuberance form with the outer lead section through an aperture of the protective film, and (v) cutting the lead frame so that the radiating regions are separated from each other.

According to the foregoing arrangement, the conductive pattern is formed only on the insulating tape, hence the conductive pattern is not prone to deformation in the middle of the manufacturing process. Therefore, the foregoing arrangement allows the step of bonding the insulating tape to the radiating member, which step relatively tends to apply stress on the insulating tape, to be conducted before the step of bonding the integrated circuit chip with the inner lead section; such manufacturing process has conventionally been infeasible since the inner lead section was formed partially outside the insulating tape. Accordingly, the foregoing manufacturing method has become selectable as a method to form the semiconductor device manufacturing method, thereby broadening the range of available manufacturing methods.

Furthermore, according to the foregoing method, a plurality of chips are simultaneously formed using a lead frame having a plurality of radiating regions, thereby resulting in that the throughput of the semiconductor device is improved as compared with the other aforementioned methods.

Furthermore, unlike a semiconductor device of the TAB type, a step of providing a device hole in the insulating tape for installation of an integrated circuit chip is unnecessary, thereby resulting in that the device manufacturing process is simplified.

The semiconductor device manufacturing method of the present invention may be arranged so that the inner lead section is bonded with the integrated circuit chip through an anisotropic material.

With the foregoing arrangement, the integrated circuit chip can be bonded with the inner lead section at a lower temperature as compared with the case where they are connected in an eutectic state, and hence, damages to the insulating tape can be avoided, while damages to the integrated circuit chip at the bonding step can be reduced. As a result, the reliability of the device can be enhanced.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device, comprising:
   a conductive pattern composed of an inner lead section and an outer lead section, said conductive pattern being provided only on an insulating tape;
   a plurality of external connection terminals in a protuberance form each, each being connected with said outer lead section at an opening of a protective film, said protective film being formed so as to cover at least said outer lead section of said conductive pattern;
   an integrated circuit chip bonded with said inner lead section so that an element-formed surface of said integrated circuit chip faces said insulating tape; and
   a first radiating member with a heat radiating property, provided on a surface of said insulating tape on a side opposite to a conductive pattern-formed side thereof so as to cover at least all regions where said external connection terminals are formed;
   a recess is formed in said first radiating member; and
   said insulating tape is bent so that said integrated circuit chip is positioned in said recess;
   wherein said insulating tape and said first radiating member do not touch each other, at least in a periphery of the chip mounting region thereof where said integrated circuit chip is installed.

2. The semiconductor device as set forth in claim 1, wherein said external connection terminals are formed in a spherical shape each.

3. The semiconductor device as set forth in claim 1, wherein a size of each external connection terminal is set so as to cause a surface of said integrated circuit chip on a side opposite to the element-formed surface side to be not in contact with an external substrate.

4. The semiconductor device as set forth in claim 1, further comprising a protective member for protecting said whole integrated circuit chip.

5. The semiconductor device as set forth in claim 1, further comprising a protective member, said protective member protecting at least the element-formed surface of said integrated circuit chip, wherein:
   said insulating tape and said integrated circuit chip are bonded to each other with said protective member provided therebetween.

6. The semiconductor device as set forth in claim 1, wherein:
   said integrated circuit chip is bonded with said inner lead section through an anisotropic conductive material; and
   said anisotropic conductive material serves as a protective member protecting at least the element-formed surface of said integrated circuit chip.

7. The semiconductor device as set forth in claim 1, wherein said insulating tape has slits around a region thereof where said integrated circuit chip is installed.

8. The semiconductor device as set forth in claim 1, wherein said insulating tape has cuts around a region thereof where said integrated circuit chip is installed, the cuts extending a predetermined length from edges of said insulating tape toward inside thereof.

9. The semiconductor device as set forth in claim 8, wherein the cuts extend from edges of said insulating tape toward center, substantially along diagonals of the region where said integrated circuit chip is installed.

10. The semiconductor device as set forth in claim 1, wherein said first radiating member has slits provided around a region thereof vis-a-vis said integrated circuit chip.

11. The semiconductor device as set forth in claim 1, wherein said first radiating member has cuts around a region thereof vis-a-vis said integrated circuit chip, the cuts extending a predetermined length from edges of said first radiating member toward inside thereof.

12. The semiconductor device as set forth in claim 1, wherein a region of said insulating tape where said integrated circuit chip is installed is made to adhere to said first radiating member.

13. The semiconductor device as set forth in claim 1, wherein said first radiating member has a uniform thickness and is bent so as to have a level difference in a thickness direction so that said recess is formed.

14. The semiconductor device as set forth in claim 1, wherein said insulating tape is not in contact with said first radiating member inside said recess.

15. The semiconductor device as set forth in claim 14, wherein:
   at least the element-formed surface of said integrated circuit chip is protected by a protective member; and
   said insulating tape has a perforation at a position corresponding to the region where said integrated circuit chip is installed, so that said protective member reaches a first radiating member side of said insulating tape through said perforation.

16. The semiconductor device as set forth in claim 1, further comprising a third radiating member with a heat radiating property, provided on a surface of said integrated circuit chip on a side opposite to an element-formed side thereof.

17. A semiconductor device, comprising:
   a conductive pattern composed of an inner lead section and an outer lead section, said conductive pattern being provided only on an insulating tape;
   a plurality of external connection terminals in a protuberance form each, each being connected with said outer lead section at an opening of a protective film, said protective film being formed so as to cover at least said outer lead section of said conductive pattern;
   an integrated circuit chip bonded with said inner lead section so that an element-formed surface of said integrated circuit chip faces said insulating tape;
   a first radiating member with a heat radiating property, provided on a surface of said insulating tape on a side opposite to a conductive pattern-formed side thereof so as to cover at least all regions where said external connection terminals are formed;
   said first radiating member has an opening; and
   said insulating tape is bent so that said integrated circuit chip is positioned in said opening;
   wherein, the conductive pattern supported by the insulating tape is provided in bent shapes.

18. The semiconductor device as set forth in claim 17, further comprising a second radiating member with a heat radiating property, provided so as to close said opening of said first radiating member.

19. The semiconductor device as set forth in claim 18, wherein a portion of said insulating tape corresponding to a region where said integrated circuit chip is installed is fixed to said second radiating member.

20. A semiconductor device, comprising:
- a conductive pattern formed only on one surface of an insulating tape, said conductive pattern having an inner lead section and an outer lead section;
- an integrated circuit chip bonded with said inner lead section so that an element-formed surface thereof faces said insulating tape;
- a plurality of external connection terminals connected with said outer lead section, for connection between said integrated circuit chip and an external substrate through said conductive pattern; and
- a first radiating member formed on the other surfaces side of said insulating tape so that said first radiating member covers at least all regions where the external connection terminals are formed;
- a recess is formed in said first radiating member; and
- said insulating tape is bent so that said integrated circuit chip is positioned in said recess;
- wherein said insulating tape and said first radiating member do not touch each other, at least in a periphery of the chip mounting region thereof where said integrated circuit chip is installed.

21. The semiconductor device as set forth in claim 20, wherein a region of said insulating tape where said integrated circuit chip is installed is made to adhere to said first radiating member.

22. The semiconductor device as set forth in claim 20, wherein said first radiating member has a uniform thickness and is bent so as to have a level difference in a thickness direction so that said recess is formed.

23. The semiconductor device as set forth in claim 20, wherein said insulating tape is not in contact with said first radiating member inside said recess.

24. The semiconductor device as set forth in claim 23, wherein:
- at least the element-formed surface of said integrated circuit chip is protected by a protective member; and
- said insulating tape has a perforation at a position corresponding to the region where said integrated circuit chip is installed, so that said protective member reaches a first radiating member side of said insulating tape through said perforation.

25. A semiconductor device comprising:
- a conductive pattern formed only on one surface of an insulating tape, said conductive pattern having an inner lead section and an outer lead section;
- an integrated circuit chip bonded with said inner lead section so that an element-formed surface thereof faces said insulating tape;
- a plurality of external connection terminals connected with said outer lead section, for connection between said integrated circuit chip and an external substrate through said conductive pattern;
- a first radiating member formed on the other surface side of said insulating tape so that said first radiating member covers at least all regions where the external connection terminals are formed;
- said first radiating member has an opening; and
- said insulating tape is bent so that said integrated circuit chip is positioned in said opening;
- wherein, the conductive pattern supported by the insulating tape is provided in bent shapes.

26. The semiconductor device as set forth in claim 25, further comprising a second radiating member with a heat radiating property, provided so as to close said opening of said first radiating member.

27. The semiconductor device as set forth in claim 26, wherein a portion of said insulating tape corresponding to a region where said integrated circuit chip is installed is fixed to said second radiating member.

* * * * *